(12) United States Patent
Hirose et al.

(10) Patent No.: US 11,102,889 B2
(45) Date of Patent: *Aug. 24, 2021

(54) DESMEARING METHOD AND DESMEARING DEVICE

(71) Applicant: USHIO DENKI KABUSHIKI KAISHA, Tokyo (JP)

(72) Inventors: Kenichi Hirose, Himeji (JP); Hiroki Horibe, Himeji (JP); Tomoyuki Habu, Himeji (JP); Shinichi Endo, Himeji (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 577 days.

This patent is subject to a terminal disclaimer.

(21) Appl. No.: 14/655,046

(22) PCT Filed: Dec. 26, 2013

(86) PCT No.: PCT/JP2013/084789
§ 371 (c)(1),
(2) Date: Jun. 23, 2015

(87) PCT Pub. No.: WO2014/104154
PCT Pub. Date: Jul. 3, 2014

(65) Prior Publication Data
US 2015/0351251 A1 Dec. 3, 2015

(30) Foreign Application Priority Data

Dec. 27, 2012 (JP) .............................. JP2012-283808
Dec. 27, 2012 (JP) .............................. JP2012-283809

(51) Int. Cl.
*H05K 3/26* (2006.01)
*H05K 3/00* (2006.01)
(Continued)

(52) U.S. Cl.
CPC ......... *H05K 3/0088* (2013.01); *H05K 1/0373* (2013.01); *H05K 3/227* (2013.01);
(Continued)

(58) Field of Classification Search
CPC ....... B08B 7/00; B08B 7/0035; B08B 7/0042; B08B 7/0057; B08B 7/028; H05K 1/0373;
(Continued)

(56) References Cited

U.S. PATENT DOCUMENTS

2007/0131243 A1* 6/2007 Asahi ..................... B08B 3/12
134/1
2009/0288870 A1* 11/2009 Kondo ................ H01L 21/4846
174/261

(Continued)

FOREIGN PATENT DOCUMENTS

JP 08180757 A * 7/1996
JP H08-180757 A 7/1996
(Continued)

OTHER PUBLICATIONS

Translation of JP 2005-294700.*
(Continued)

*Primary Examiner* — Alexander Markoff
(74) *Attorney, Agent, or Firm* — Studebaker & Brackett PC

(57) ABSTRACT

Provided are a desmearing method and a desmearing device which are able to reliably remove a smear derived from any of an inorganic substance and an organic substance, and eliminate the need to use a chemical that requires a waste liquid treatment. The desmearing method of the present invention is directed to a desmearing method for a wiring substrate material that is a laminated body of insulating layers made from resin containing a filler and a conductive (Continued)

layer, and includes an ultraviolet irradiation treatment step for irradiating the wiring substrate material with ultraviolet beams with a wavelength of 220 nm or less, and a physical vibration treatment step for applying physical vibrations to the wiring substrate material which has undergone the ultraviolet irradiation treatment step.

18 Claims, 8 Drawing Sheets

(51) Int. Cl.
 H05K 3/22 (2006.01)
 H05K 1/03 (2006.01)
(52) U.S. Cl.
 CPC ....... *H05K 3/26* (2013.01); *H05K 2201/0209* (2013.01); *H05K 2203/0285* (2013.01); *H05K 2203/0292* (2013.01); *H05K 2203/075* (2013.01); *H05K 2203/0743* (2013.01); *H05K 2203/0766* (2013.01); *H05K 2203/081* (2013.01); *H05K 2203/087* (2013.01); *H05K 2203/1509* (2013.01)
(58) Field of Classification Search
 CPC ........ H05K 3/0088; H05K 3/227; H05K 3/26; H05K 2201/0209; H05K 2203/0285; H05K 2203/0292; H05K 2203/0743; H05K 2203/075; H05K 2203/0766; H05K 2203/082; H05K 2203/087; H05K 2203/1509; H05K 2203/081
 See application file for complete search history.

(56) References Cited

U.S. PATENT DOCUMENTS

| | | | |
|---|---|---|---|
| 2012/0018194 A1* | 1/2012 | Maeda | H05K 3/0035 174/251 |
| 2013/0199830 A1* | 8/2013 | Morita | C08L 63/00 174/258 |
| 2015/0351251 A1* | 12/2015 | Hirose | H05K 3/0088 134/1 |
| 2016/0199887 A1* | 7/2016 | Takezoe | B08B 3/123 134/1 |

FOREIGN PATENT DOCUMENTS

| | | |
|---|---|---|
| JP | 2005-050999 A | 2/2005 |
| JP | 2005294700 A * | 10/2005 |
| JP | 2007-158238 A | 6/2007 |
| JP | 2012-217536 A | 11/2012 |

OTHER PUBLICATIONS

Translation of JP 08-180757.*
International Search Report; PCT/JP2013/084789; dated Apr. 1, 2014.

* cited by examiner

DESMEARING METHOD AND DESMEARING DEVICE

TECHNICAL FIELD

The present invention relates to a desmearing method and a desmearing device, which are applied to a wiring substrate material including a laminated body of insulation layers, which are made from resin containing a filler, and a conductive layer.

BACKGROUND ART

For example, one of known wiring substrates that support semiconductor elements, such as semiconductor integrated circuit elements, thereon is a multi-layer wiring substrate that includes insulation layers and conductive layers (wiring layers) laminated alternately. In such multi-layer wiring substrate, via holes and/or through holes that extend through one or a plurality of insulation layers in a thickness direction of the insulation layer(s) are formed to electrically connect one conductive layer to another conductive layer In a process of fabricating a multi-layer wiring substrate, drilling and/or laser beam machining is applied to the wiring substrate material, which includes the laminated body of insulation layers and conductive layers, to remove some parts of the insulation layers and/or conductive layers and form the via holes and/or through holes. When the via holes and/or through holes are formed, smear is produced on the wiring substrate material. The smear is derived from the materials of the insulation layers and conductive layers. Thus, a desmearing process is applied to the wiring substrate material to remove the smear.

Conventionally known desmearing processes for the wiring substrate material include a wet-type desmearing process, and a dry-type desmearing process (see Patent Literature 1 and Patent Literature 2).

The wet-type desmearing process is a smear removing method that immerses the wiring substrate material in an alkaline solution, which is a solution of potassium permanganate and sodium hydroxide, in order to dissolve or exfoliate (detach) the smear that remains on (in) the wiring substrate material. On the other hand, the dry-type desmearing process is a smear removing method that irradiates the wiring substrate material with an ultraviolet beam and dissolves the smear with ozone, which is generated upon the ultraviolet irradiation, and the energy of the ultraviolet beam.

However, the wet-type desmearing process has problems, e.g., a long time is required to dissolve the smear in the alkaline solution, a cleaning process and a neutralizing process are necessary after the wiring substrate material is immersed in the alkaline solution, and a waste liquid treatment is needed to the alkaline solution after it is used in the process. Thus, the wet-type desmearing process becomes considerably costly.

In recent years, there is a demand for formation of small-diameter via holes as the fine wiring pattern is needed on the wiring substrate. When the desmearing process is carried out to the wiring substrate material having small-diameter via holes, the alkaline solution does not penetrate into the via holes sufficiently. Thus, it is difficult to reliably perform a desmearing process in a desired manner.

On the other hand, when the dry-type desmearing process is employed, it is possible to perform the desmearing process in a short(er) time. Also, the cleaning and neutralization to the wiring substrate material is unnecessary, and the waste liquid treatment is unnecessary. Thus, it is possible to reduce the cost for the desmearing process. In addition, this desmearing process can be applied to the wiring substrate material having small-diameter via holes.

However, the inventors found that the conventional dry-type desmearing process had the following problems.

In the conventional dry-type desmearing process, the smear derived from the organic substances such as resin contained in the insulation layers is dissolved and removed by actions and influences of the ultraviolet beams and the ozone. However, the smear derived from the inorganic substances such as the ceramic of the filler contained in the insulation layers and the metal of the conductive layers is not dissolved by the actions and influences of the ultraviolet beams and the ozone. Such smear remains on the wiring substrate material.

LISTING OF REFERENCES

Patent Literatures

Patent Literature 1: Japanese Patent Application Laid-Open Publication No. 2012-217536
Patent Literature 2: Japanese Patent Application Laid-Open Publication No. 8-180757

SUMMARY OF THE INVENTION

Problems to be Solved by the Invention

The present invention was developed in view of the above-mentioned facts, and an object of the present invention is to provide a desmearing method and a desmearing device that can reliably remove the smear derived from any of the inorganic substance and the organic substance and does not use chemicals that would require the waste liquid treatment.

Solution to the Problems

A desmearing method according to one aspect of the present invention is directed to a desmearing method for a wiring substrate material that is a laminated body of insulating layers made from resin containing a filler and a conductive layer, and includes an ultraviolet irradiation treatment step for irradiating the wiring substrate material with an ultraviolet beam with a wavelength of 220 nm or less, and a physical vibration treatment step for applying physical vibrations to the wiring substrate material which has undergone the ultraviolet irradiation treatment step.

Preferably, the ultraviolet irradiation treatment step of the desmearing method according to the present invention is carried out in an atmosphere containing oxygen.

Preferably, the wiring substrate material has a through hole that penetrates through the insulation layer, and more preferably the through hole that penetrates through the insulation layer is formed by laser beam machining.

Preferably, the ultraviolet irradiation treatment step and the physical vibration treatment step are carried out alternately and repeatedly.

Preferably, the physical vibration treatment step includes an ultrasonic vibration treatment.

Preferably, the ultraviolet irradiation treatment step of the desmearing method according to the present invention is carried out, with that part (treatment target part) of the wiring substrate material which is subject to the ultraviolet irradiation treatment step being in a wet condition.

Preferably, as a pretreatment to be performed prior to the ultraviolet irradiation treatment step, the desmearing process further includes a wetting step of immersing the wiring substrate material in water and causing the water to supersonic-vibrate, with the wiring substrate material being in water, thereby wetting the treatment target part of the wiring substrate material.

Preferably, as a pretreatment to be performed prior to the ultraviolet irradiation treatment step, the desmearing method includes a wettability improvement step of improving wettability of the treatment target part of the wiring substrate material, with the treatment target part of the wiring substrate material being not in a wet condition, and a wetting step of wetting the treatment target part of the wiring substrate material which has undergone the wettability improvement step.

Preferably, the wettability improvement step includes a dry-type ultraviolet beam irradiation treatment that irradiates the treatment target part of the wiring substrate material with an ultraviolet beam while the treatment target part is not in a wet condition.

Preferably, the wetting step and the wet-type ultraviolet irradiation treatment step are carried out alternately and repeatedly prior to the physical vibration treatment step.

Preferably, the ultraviolet irradiation treatment step and the physical vibration treatment step are carried out alternately and repeatedly.

A desmearing device according to another aspect of the present invention is directed to a desmearing device for a wiring substrate material that is a laminated body of insulating layers made from resin containing a filler and a conductive layer, and includes an ultraviolet irradiation treatment unit configured to irradiate the wiring substrate material with an ultraviolet beam with a wavelength of 220 nm or less, and a physical vibration treatment unit configured to apply physical vibrations to the wiring substrate material which is ultraviolet-treated by the ultraviolet irradiation treatment unit.

Preferably, the physical vibration treatment unit of the desmearing device according to the present invention applies the physical vibrations to the wiring substrate material by means of an ultrasonic vibration treatment.

Preferably, the ultraviolet irradiation treatment unit has a treatment chamber to receive the wiring substrate material, and a gas feed opening configured to feed a treatment gas containing oxygen into the treatment chamber.

Preferably, the desmearing device includes a wetting unit configured to wet that part (treatment target part) of the wiring substrate material which is subject to the ultraviolet irradiation treatment before the wiring substrate material is treated by the ultraviolet irradiation treatment unit.

Preferably, the wetting unit immerses the wiring substrate material in water, and causes the water to supersonic-vibrate while the wiring substrate material is in the water, thereby wetting the treatment target part of the wiring substrate material.

Preferably, the desmearing device includes a dry-type ultraviolet irradiation unit configured to irradiate the treatment target part of the wiring substrate material with an ultraviolet beam before the wiring substrate material is treated by the wetting unit.

Advantageous Effects of the Invention

When the desmearing method of the present invention performs the ultraviolet irradiation treatment step in the atmosphere containing oxygen, the atmosphere gas is irradiated with the ultraviolet beam at the wavelength equal to or less than 220 nm so that ozone and active oxygen (reactive oxygen) are generated. The smear derived from the organic substance is dissolved by the ozone and the active oxygen generated upon irradiation of the ultraviolet beam and by the energy of the ultraviolet beam.

When the ultraviolet irradiation treatment step is applied to the treatment target part of the wiring substrate material while the treatment target part of the wiring substrate material is in the wet condition, then the water is irradiated with the ultraviolet beam having the wavelength of 220 nm or less and therefore an OH radical and other substances are generated. Thus, the smear derived from the organic substance is dissolved by the OH radial and other substances, which are generated upon irradiation of the ultraviolet beam, and the energy of the ultraviolet beam. Because the OH radical has greater oxidizability than the ozone and active oxygen, the smear derived from the organic substance is dissolved in a short(er) time.

In the ultraviolet irradiation treatment step, the smear derived from the inorganic substance is not dissolved, but remains on the wiring substrate material. However, the smear derived from the inorganic substance, e.g., an inorganic substance such as silica and alumina, becomes fragile upon irradiation of the ultraviolet beam. Thus, the physical vibrations are applied to the wiring substrate material during the physical vibration treatment step subsequent to the ultraviolet irradiation treatment step to destroy (break) the smear derived from the inorganic substance and cause the smear to leave the wiring substrate material. Alternatively, small gaps are created in the smear due to shrinkage of the smear derived from the inorganic substance or due to a thermal expansion difference upon irradiation of the ultraviolet beam to the smear. In this manner, the smear derived from the inorganic substance is caused to leave the wiring substrate material upon application of the physical vibration treatment.

Therefore, the desmearing method of the present invention can reliably remove the smear even if the smear is derived from any of the inorganic substance and the organic substance.

Use of the chemicals, which would necessitate the waste liquid treatment later, becomes unnecessary because the ultraviolet irradiation treatment and the physical vibration treatment are only needed to be applied to the wiring substrate material.

DETAILED DESCRIPTION OF THE INVENTION

Figure 1:
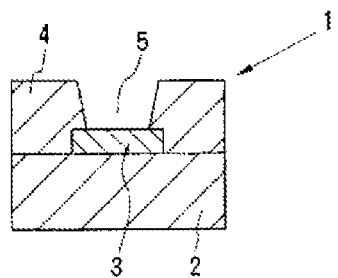
FIG. 1 is a cross-sectional view useful to describe major parts of an exemplary wiring substrate material, which is a target material of a desmearing method according to one embodiment of the present invention.

A desmearing method according to an embodiment of the present invention will now be described.
Desmearing Method FIG. 1 is a schematic cross-sectional view that shows major portions of an exemplary wiring substrate material, which is a treatment target of a desmearing method according to an embodiment of the present invention. The wiring substrate material 1 includes a first insulation layer 2, a conductive layer (wiring layer) 3 laminated on top of the first insulation layer 2 and having a predetermined pattern, and a second insulation layer 4 laminated on the first insulation layer 2 and the conductive layer 3. The second insulation layer 4 has a through hole 5, such as a via hole, which extends in a thickness direction of the second insulation layer. The through hole 5 exposes part of the conductive layer 3.

Each of the first insulation layer 2 and the second insulation layer 4 is made from resin that contains a granular filler. The filler is an organic substance.

The resin used for the first insulation layer 2 and the second insulation layer 4 may be epoxy resin, bismaleimide-triazine resin, polyimide resin, polyester resin or the like.

The material of the filler contained in the first insulation layer 2 and in the second insulation layer 4 may include silica, alumina, mica, silicate, barium sulfate, magnesium hydroxide, titanium oxide or the like. An average grain diameter of the filler is, for example, between 0.1 μm and 3 μm inclusive.

A percentage of the filler contained in each of the first and second insulation layers 2 and 4 is, for example, between 20 mass % and 60 mass % inclusive.

The material of the conductive layer 3 may be copper, nickel, gold or the like.

The thickness of the first insulation layer 2 is, for example, between 20 μm and 800 μm inclusive. The thickness of the second insulation layer 4 is, for example, between 10 μm and 50 μm inclusive. The thickness of the conductive layer 3 is, for example, between 10 μm and 100 μm inclusive. The diameter of the through hole 5 is, for example, between 30 μm and 100 μm inclusive.

The wiring substrate material 1 having the above-described structure is prepared in, for example, the following manner.

Figure 2A:
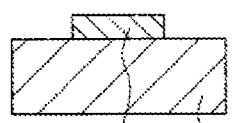
FIG. 2(a) is a cross-sectional view useful to describe a first step of a process for fabricating the wiring substrate material shown in FIG. 1.
Figure 2B:
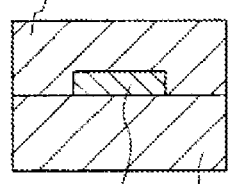
FIG. 2(b) is a cross-sectional view useful to describe a second step of the process for fabricating the wiring substrate material shown in FIG. 1.
Figure 2C:
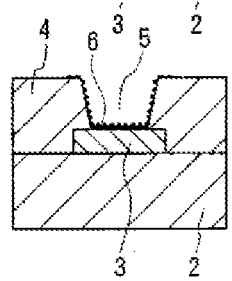
FIG. 2(c) is a cross-sectional view useful to describe a third step of the process for fabricating the wiring substrate material shown in FIG. 1.

Firstly, as shown in FIG. 2(a), the conductive layer 3 having a desired pattern is formed on the surface of the first insulation layer 2. Subsequently, as shown in FIG. 2(b), the second insulation layer 4 is formed on the surface of the first insulation layer 2 and the conductive layer 3. Then, as shown in FIG. 2(c), the through hole 5 is formed at a desired location in the second insulation layer 4 such that the through hole 5 extends in the thickness direction of the second insulation layer 4.

A method for forming the conductive layer 3 to be employed in the foregoing is not limited to a particular method. For example, various methods such as subtractive process, a semi-additive process and the like may be employed.

A method for forming the second insulation layer 4 may include applying an insulation layer material, which has liquid thermosetting resin and a filler contained in the resin, onto the surface of the first insulation layer 2 and the conductive layer 3, and curing the insulation layer material. Another method for forming the second insulation layer 4 may include bonding an insulation sheet, which contains a filler, on the surface of the first insulation layer 2 and the conductive layer 3 by thermocompression bonding or the like.

A method for forming the through hole 5 in the second insulation layer 4 may include drilling or laser beam machining. When the laser beam machining is employed to make the through hole 5, a carbon dioxide ($CO_2$) laser device or a YAG laser device may be used.

In the wiring substrate material 1 prepared in the above-described manner, smear 6 that is generated upon formation of the through hole 5 remains on an inner wall of the through hole 5 in the second insulation layer 4, on a peripheral area around the through hole 5 on the surface of the second insulation layer 4, on a bottom of the through hole 5 (i.e., an exposed surface of the conductive layer 3 in the through hole 5) and the like.

The desmearing method according to an embodiment of the present invention includes an ultraviolet irradiation treatment step of irradiating a treatment target part of the wiring substrate material 1 with an ultraviolet beam, and a physical vibration treatment step of applying physical vibrations to the wiring substrate material 1 that has undergone the ultraviolet irradiation treatment step. The treatment target part of the wiring substrate material is that part of the wiring substrate which is treated by the ultraviolet irradiation treatment step or by the desmearing method.

In the present invention, the ultraviolet irradiation treatment step may be carried out in an atmosphere containing oxygen (e.g., air).

In the ultraviolet irradiation treatment step, the ultraviolet beam directed to the wiring substrate material 1 may have a dominant wavelength at 200 nm or less than 200 nm, and preferably at 190 nm or less than 190 nm. If the wavelength of the ultraviolet beam exceeds 200 nm, dissolving and removing the smear, which is generated from the organic substance such as resin, becomes difficult.

A light source for the ultraviolet beam at the wavelength equal to or less than 220 nm may be a xenon excimer lamp (peak wavelength=172 nm), a low-pressure mercury lamp (185 nm bright line), a rare gas fluorescent lamp or the like. The irradiance of the ultraviolet beam directed to the wiring substrate material 1 is, for example, 10 to 1000 mW/cm². The irradiation time of the ultraviolet beam to the wiring substrate material 1 is appropriately decided depending upon the irradiance of the ultraviolet beam and an amount of smear remaining. For example, the irradiation time of the ultraviolet beam to the wiring substrate material 1 is 30 seconds to 180 minutes.

Figure 3A:
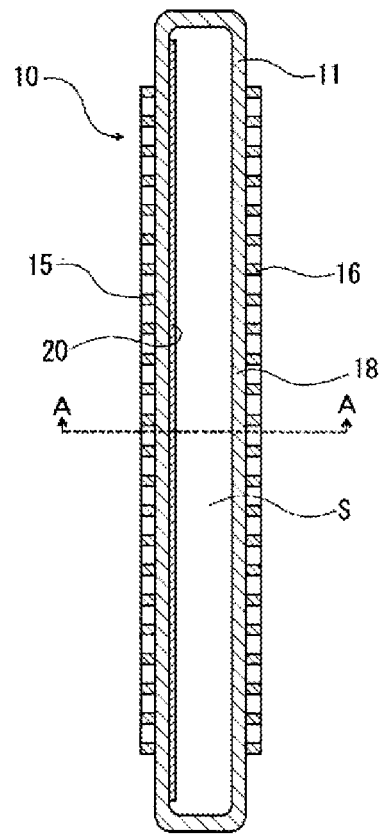
FIG. 3(a) shows a lateral cross-sectional view of a discharge container in a longitudinal direction.
Figure 3B:
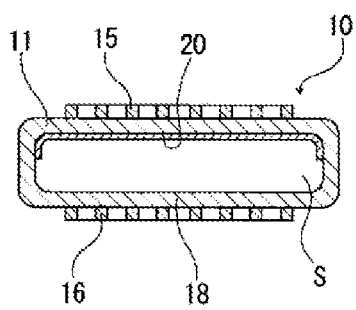
FIG. 3(b) shows a cross-sectional view taken along the line A-A in FIG. 3(a).

FIG. 3 is a set of cross-sectional views useful to describe a schematic structure of an exemplary excimer lamp used as a light source of an ultraviolet beam having a wavelength equal to or less than 220 nm. Specifically, FIG. 3(a) is a lateral cross-sectional view taken along the longitudinal direction of a discharge container, and FIG. 3(b) is a cross-sectional view taken along the line A-A in FIG. 3(a).

The excimer lamp 10 includes a discharge container 11 having opposite ends airtightly sealed. A discharge space S is defined in the discharge container 11. The discharge container 11 has a rectangular shape when viewed in its cross-section. The discharge container 11 is a hollow elongated element. A gas that is, for example, a xenon gas or a mixture of argon and chlorine, is sealed in the discharge container 11 as a discharge gas.

The discharge container 11 is made from silica glass, which allows a vacuum ultraviolet beam to favorably pass therethrough, such as synthetic silica glass, and serves as a dielectric.

A pair of grid-like electrodes 15 and 16 are arranged on long-side outer surfaces of the discharge container 11, i.e., one electrode 15 that serves as a high voltage feed electrode and another electrode 16 that serves as an earth electrode are arranged. The electrodes extend in the longitudinal direction of the discharge container, and disposed on the opposite outer surfaces of the discharge container. Thus, the discharge container 11, which serves as the dielectric, is interposed between the two electrodes 15 and 16.

The electrodes may be provided, for example, by applying a paste of electrode material (metal) onto the discharge container 11, or by printing or vapor depositing the electrode material on the discharge container 11.

As electricity for lighting is supplied to one electrode 15 of the two electrodes of the excimer lamp 10, a discharge is generated between the two electrodes 15 and 16 via the wall of the discharge container 11, which serves as the dielectric. As a result, excimer molecules are generated, and a vacuum ultraviolet beam is emitted from the excimer molecules (i.e., excimer discharge takes place). In order to efficiently use the vacuum ultraviolet beam generated by the excimer discharge, an ultraviolet reflection film 20 is disposed on the inner surface of the discharge container 11. The ultraviolet reflection film 20 is made from silica particles and alumina particles. When a xenon gas is used as the discharge gas, a vacuum ultraviolet beam having a peak at a wavelength of 172 nm is emitted. When a mixture of argon and chlorine is used as the discharge gas, a vacuum ultraviolet beam having a peak at a wavelength of 175 nm is emitted.

The ultraviolet reflection film 20 extends, for example, over that inner surface of the long-side plane of the discharge container 11 which corresponds to the first electrode 15 (i.e., the high voltage feed electrode) and part of that inner surface of the short-side plane which is continuous to the inner surface of the long-side plane. On that inner surface of the long-side plane of the discharge container 1 which corresponds to the opposite electrode 16 (i.e., earth electrode), there is provided no ultraviolet reflection film 20, and therefore a light emission part (aperture part) 18 is formed.

Preferably, the thickness of the ultraviolet reflection film 20 is, for example, 10 to 100 μm.

The silica particles and alumina particles of the ultraviolet reflection film 20 themselves have a vacuum ultraviolet permeability (transmissivity) with a high refractive index. Thus, part of the vacuum ultraviolet beam arriving at the silica particles or alumina particles is reflected by the surfaces of the particles whereas another part of the vacuum ultraviolet beam is refracted by the surfaces of the particles and is incident into the particles. The light incident to the particles is mostly transmitted, and part of the light is absorbed. The transmitted light is refracted again when the light exits the ultraviolet reflection film. Such reflection and refraction take place repeatedly in the ultraviolet reflection film. Thus, the ultraviolet reflection film has a "diffuse(d) reflection" function that causes the above-described reflection and refraction repeatedly.

The ultraviolet reflection film 20 is made from the silica particles and the alumina particles. In other words, the ultraviolet reflection film 20 is made from ceramics. Therefore, the ultraviolet reflection film 20 does not produce impurity gases, and can withstand the discharge.

The silica particles of the ultraviolet reflection film 20 may include fine particles of silica glass, which may be obtained, for example, by pulverizing the silica glass.

The silica particles have particular grain diameters. The definition of the grain diameter will be given below. The silica particles have the grain diameters between, for example, 0.01 μm and 20 μm inclusive. For example, the center grain diameter (peak value of the arithmetic average grain diameter) is preferably between 0.1 μm and 10 μm inclusive, and more preferably between 0.3 μm and 3 μm inclusive.

The percentage of the silica particles having the center grain diameter is preferably equal to or greater than 50%.

The alumina particles of the ultraviolet reflection film 20 have the arithmetic average grain diameters between, for example, 0.1 μm and 10 μm inclusive. For example, the center grain diameter (peak value of the arithmetic average grain diameter) is preferably between 0.1 μm and 3 μm inclusive, and more preferably between 0.3 μm and 1 μm inclusive.

The percentage of the alumina particles having the center grain diameter is preferably equal to or greater than 50%.

In the present invention, the ultraviolet irradiation treatment step may be carried out while that part (treatment target part) of the wiring substrate material 1 which is treated by the ultraviolet irradiation treatment is in a wet condition. In this case, preferably, a pretreatment may be performed prior to the ultraviolet irradiation treatment step. The pretreatment may include a wettability improvement treatment for improving the wettability of the treatment target part of the wiring substrate material 1, with the treatment target part being not in the wet condition, and a wetting treatment for wetting the treatment target part of the wiring substrate material 1 that has undergone the wettability improvement step.

The wettability improvement treatment may be a dry-type ultraviolet irradiation treatment that irradiates the treatment target part of the wiring substrate material with the ultraviolet beam while the treatment target part of the wiring substrate material is not in the wet condition, an atmospheric pressure plasma treatment, a reduced pressure plasma treatment, or a corona discharge treatment. Preferably, the dry-type ultraviolet irradiation treatment is used.

For example, the dry-type ultraviolet irradiation treatment is carried out in an atmosphere containing oxygen (e.g., in the air).

The wavelength of the ultraviolet beam directed to the wiring substrate material during the dry-type ultraviolet irradiation treatment is preferably equal to or less than 220 nm, and more preferably equal to or less than 190 nm. If the wavelength of the ultraviolet beam exceeds 220 nm, it becomes difficult to reliably improve the wettability of the treatment target part of the wiring substrate material. A light source for the ultraviolet beam having the wavelength equal to or less than 220 nm may be a xenon excimer lamp (peak wavelength is 172 nm), a low-pressure mercury lamp (185 nm bright line), a rare gas fluorescent lamp, or the like. A specific example of the excimer lamp that can be used as the light source for the ultraviolet beam having the wavelength equal to or less than 220 nm is the excimer lamp shown in FIG. 3, which is used in the above-described ultraviolet irradiation treatment.

The irradiance of the ultraviolet beam directed to the wiring substrate material 1 is, for example, 10 to 200 mW/cm$^2$. The irradiation time of the ultraviolet beam to the wiring substrate material 1 may appropriately be decided depending upon the irradiance of the ultraviolet beam, the material of the wiring substrate material 1 and the like. The irradiation time of the ultraviolet beam to the wiring substrate material 1 is, for example, between 10 seconds and 60 seconds inclusive.

The wetting treatment is carried out by, for example, immersing the wiring substrate material 1 in water. The immersing time is, for example, between 10 seconds and 60 seconds.

It should be noted that the wiring substrate material may be immersed in the water and the water may be forced to vibrate by a supersonic wave. Because this allows the water to enter the through hole of the wiring substrate material in a short time, it is possible to reduce the immersing time.

After the wiring substrate material is immersed in the water for a predetermined or sufficient time, excessive (unnecessary) water present on the treatment target part of the wiring substrate material may be removed by, for example, an air knife.

The physical vibration treatment step may be performed by a supersonic vibration treatment. The frequency of the supersonic wave (ultrasonic wave) used in the supersonic vibration treatment is preferably 20 to 70 kHz. If the frequency exceeds 70 kHz, it is difficult to destroy the smear derived from the inorganic substance and cause the smear to leave the wiring substrate material.

In such supersonic vibration treatment, a vibration medium of the supersonic wave may be a liquid such as water, or may be a gas such as air.

Specifically, when the water is used as the vibration medium, the wiring substrate material 1 is immersed in, for example, water. With this condition being maintained, the water is forced to vibrate with a supersonic wave, thereby carrying out the supersonic vibration treatment. When the liquid is used as the vibration medium of the supersonic wave, then the treatment time for the supersonic vibration treatment is, for example, 10 to 600 seconds.

When the air is used as the vibration medium, the pressurized air (compressed air) is forced to vibrate with a supersonic wave and sprayed to the wiring substrate material 1, thereby performing the supersonic vibration treatment. The pressure of the compressed air is preferably equal to or greater than 0.2 MPa. The treatment time for the supersonic vibration treatment with the compressed air is, for example, 5 to 60 seconds.

In the desmearing method according to an embodiment of the present invention, the above-described wetting treatment and the ultraviolet irradiation treatment may be carried out alternately and repeatedly prior to the physical vibration treatment.

How many times the wetting treatment and the ultraviolet irradiation treatment are repeated may be decided appropriately depending upon the irradiation time of the ultraviolet beam during each wet-type ultraviolet irradiation treatment. For example, it is 1 to 5 times.

This method can ensure that the treatment target part of the wiring substrate material is in a wet condition. Thus, the smear derived from the organic substance is dissolved at a high efficiency during each of the wet-type ultraviolet irradiation treatments. As a result, it is possible to reduce a total time of ultraviolet irradiation in the entire wet-type ultraviolet irradiation treatments.

It should be noted that the ultraviolet irradiation treatment and the physical vibration treatment may be carried out in this order one time only. However, it is preferred that the ultraviolet irradiation treatment and the physical vibration treatment are carried out alternately and repeatedly.

How many times the ultraviolet irradiation treatment and the physical vibration treatment are repeated may be decided appropriately depending upon the irradiation time of the ultraviolet beam during each ultraviolet irradiation treatment. For example, it is 1 to 5 times.

In the following description, the ultraviolet irradiation treatment and the physical vibration treatment are carried out twice respectively in the desmearing method according to an embodiment of the present invention.

Figure 4A:
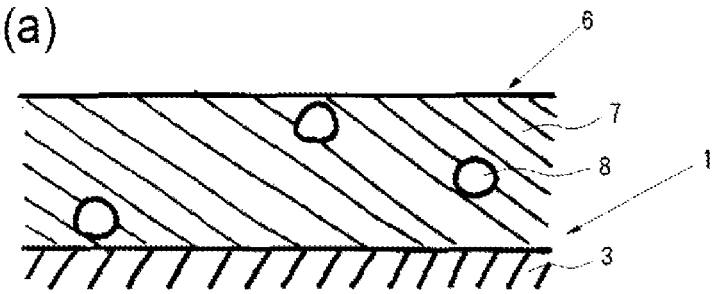
FIG. 4(a) to FIG. 4(e) are a series of views useful to describe steps of an exemplary desmearing method according to an embodiment of the present invention.

As shown in FIG. 4(a), the wiring substrate material 1 prior to the desmearing treatment has the smear 6 remaining on the treatment target part of the wiring substrate material 1, for example, the conductive layer 3. The smear 6 includes smear derived from an organic substance such as resin (occasionally referred to as "organic substance smear" hereinafter) 7, and another smear 8 derived from an inorganic substance such as a filler (occasionally referred to as "inorganic substance smear" hereinafter). The smear 8 is contained in the organic substance smear 7.

Oxygen in the atmosphere gas reacts with the ultraviolet beam to generate ozone and active oxygen as the treatment target part of the wiring substrate material 1 is irradiated with the ultraviolet beam having the wavelength equal to or less than 220 nm in the atmosphere containing oxygen. Part of the organic substance smear 7 is dissolved and gasified by the ozone and active oxygen generated upon irradiation of the ultraviolet beam and the energy of the ultraviolet beam. When the wiring substrate material 1 is brought into a wet condition by the wetting treatment, the water reacts with the ultraviolet beam to generate OH radical and other substances as the treatment target part of the wiring substrate material 1 is irradiated with the ultraviolet beam having the wavelength equal to or less than 220 nm. Part of the organic substance smear 7 is dissolved and gasified by the OH radical and other substances generated upon irradiation of the ultraviolet beam to the water and the energy of the ultraviolet beam.

Figure 4B:
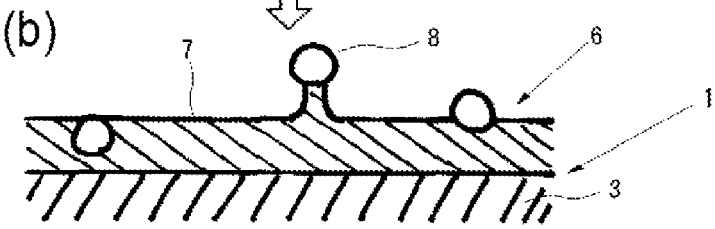
Figure 4C:
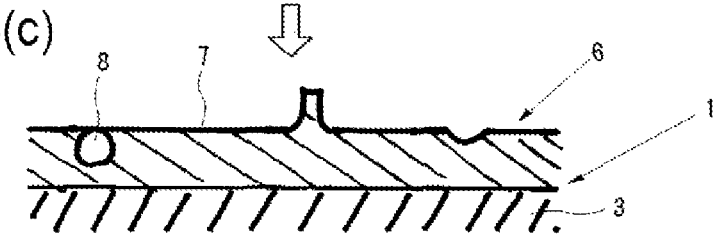
Figure 4D:
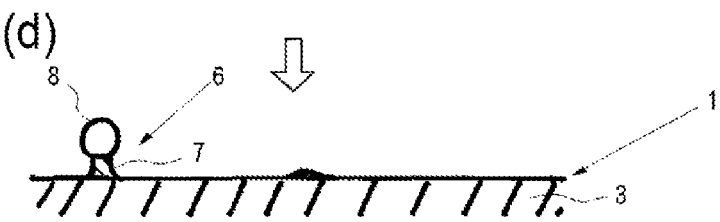
Figure 4E:
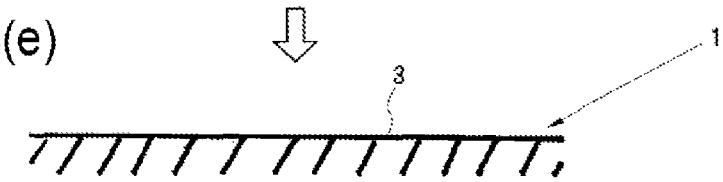

As a result, as shown in FIG. 4(b), part of the organic substance smear 7 is removed from the wiring substrate material 1. At the same time, part of the inorganic substance smear 8 is exposed upon removal of part of the organic substance smear 7. The exposed inorganic substance smear 8 (i.e., the inorganic substance smear 8 such as silica and alumina) becomes fragile upon irradiation of the ultraviolet beam. The inventors consider that this is because the inorganic substance smear 8 shrinks upon receiving the ultraviolet beam, and the inorganic substance smear 8 deforms (is distorted).

Subsequently, the physical vibration treatment is applied to the wiring substrate material 1. The exposed inorganic substance smear 8 is destroyed by the mechanical action due to the vibrations, and leaves the wiring substrate material 1. It is also expected that the shrinkage of the inorganic substance smear 8 and the thermal expansion difference generated upon irradiation of the ultraviolet beam to the smear 7 and 8 can create small gaps between the organic substance smear 7 and the inorganic substance smear 8. In this manner, the inorganic substance smear 8 is separated from the wiring substrate material 1 upon application of the physical vibration treatment.

As a result, as shown in FIG. 4 (*c*), part of the inorganic substance smear 8 is removed from the wiring substrate material 1.

After that, the treatment target part of the wiring substrate material 1 is irradiated with the ultraviolet beam having the wavelength equal to or less than 220 nm. Accordingly, most of the remaining organic substance smear 7 is dissolved and gasified by the energy of the ultraviolet beam and the ozone and active oxygen generated upon irradiation of the ultraviolet beam. As a consequence, as shown in FIG. 4(*d*), most of the remaining organic substance smear 7 is removed from the wiring substrate material 1. The remaining inorganic substance smear 8 is exposed as most of the remaining organic substance smear 7 is removed. The exposed inorganic substance smear 8 becomes fragile upon irradiation of the ultraviolet beam.

Subsequently, the physical vibration treatment is applied to the wiring substrate material 1 such that the exposed inorganic substance smear 8 and the remaining organic substance smear 7 are destroyed by the mechanical action due to the vibrations and caused to leave the wiring substrate material 1. Also, the shrinkage of the inorganic substance smear 8 and the thermal expansion difference generated upon irradiation of the ultraviolet beams to the smear 7 and 8 may create small gaps between the wiring substrate material 1 and the inorganic substance smear 8. Thus, the inorganic substance smear 8 and the organic substance smear 7 are separated from the wiring substrate material 1 upon application of the physical vibration treatment. As a result, as illustrated in FIG. 4(*e*), the remaining inorganic substance smear 8 and the remaining organic substance smear 7 are taken away from the wiring substrate material 1. This exposes, for example, the surface of the conductive layer 3.

In this manner, when the ultraviolet irradiation treatment and the physical vibration treatment are performed alternately and repeatedly in the desmearing method, it is possible to reduce the total time of ultraviolet irradiation in the ultraviolet irradiation treatments, as compared to when the ultraviolet irradiation treatment is carried out only once in the desmearing method. The inventors assume that this is because the organic substance smear 7 deteriorates even if the organic substance smear 7 is not dissolved by the irradiation of the ultraviolet beam and remains. Consequently, the organic substance smear 7 is caused to leave the wiring substrate material 1 by the physical vibration treatment, and the removal of the organic substance smear 7 is achieved.

When the wiring substrate material 1 is in the wet condition, the dissolving takes place with the OH radical, the ozone and the active oxygen. Because the OH radical has a faster dissolving speed than the ozone and the active oxygen, it is possible to ensure a long OH radical reaction time as the ultraviolet irradiation treatments are repeated. This can reduce the total time of ultraviolet irradiation.

As described above, when the desmearing method according to the embodiment of the present invention carries out the ultraviolet irradiation treatment in the atmosphere containing oxygen, the atmosphere gas is irradiated with the ultraviolet beam having the wavelength equal to or less than 220 nm so that the ozone and the active oxygen are generated. Then, the organic substance smear 7 is dissolved by the energy of the ultraviolet beam and by the ozone and active oxygen generated upon irradiation of the ultraviolet beam. When the ultraviolet irradiation treatment is carried out while the treatment target part of the wiring substrate material 1 is wet, the water is irradiated with the ultraviolet beam having the wavelength equal to or less than 220 nm and therefore the OH radical and other substances are produced. Thus, the organic substance smear 7 is dissolved by the energy of the ultraviolet beam and by the OH radial and other substances produced upon irradiation of the ultraviolet beam. Because the OH radical has greater oxidizability than the ozone and the active oxygen, the organic substance smear 7 is dissolved in a short(er) time.

The inorganic substance smear 8 is not dissolved in the ultraviolet irradiation treatment, and remains on the wiring substrate material 1. However, the inorganic substance smear 8 becomes fragile as the inorganic substance smear 8 is irradiated with the ultraviolet beam. Thus, the inorganic substance smear 8 is destroyed as the physical vibrations are applied to the wiring substrate material 1 in the physical vibration treatment subsequent to the ultraviolet irradiation treatment, or the inorganic substance smear 8 exfoliates from (through) the small gaps between the inorganic substance smear 8 and the organic substance smear 7 and is separated from the wiring substrate material 1.

Therefore, the desmearing method according to the embodiment of the present invention can reliably remove any of the inorganic substance smear 8 and the organic substance smear 7 from the wiring substrate material 1.

In addition, use of chemicals that would require a waste liquid treatment is unnecessary because the ultraviolet irradiation treatment and the physical vibration treatment are only required to be applied to the wiring substrate material 1.

Desmearing Device

Figure 5:
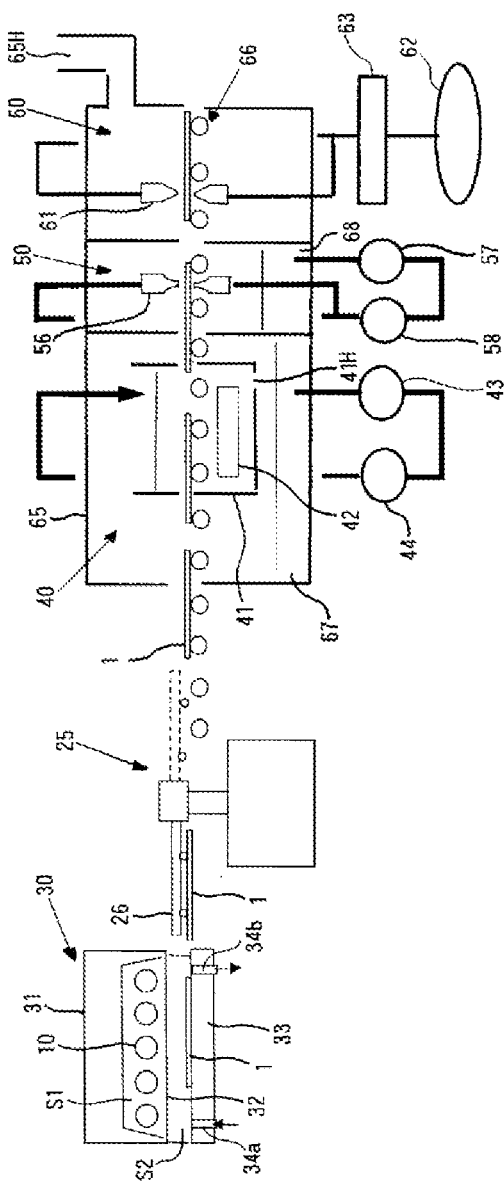
FIG. 5 is a view useful to describe a configuration of a desmearing device according to a first example of the present invention.

FIG. 5 is a view useful to describe a first exemplary configuration of the desmearing device according to the present invention. This desmearing device includes an ultraviolet irradiation treatment unit 30 that irradiates the wiring substrate material 1 with the ultraviolet beams having the wavelength equal to or less than 220 nm. At a position downstream of the ultraviolet irradiation treatment unit 30, there is provided a physical vibration treatment unit 40 that applies physical vibrations to the wiring substrate material 1 after the wiring substrate material 1 is irradiated with the ultraviolet beams by the ultraviolet irradiation treatment unit 30. Downstream of the physical vibration treatment unit 40, there is provided a rinse treatment unit 50 that sprays water to the wiring substrate material 1 after the wiring substrate material 1 is vibration-treated by the physical vibration treatment unit 40. A drying treatment unit 60 is provided downstream of the rinse treatment unit 50. The drying treatment unit 60 is configured to dry the wiring substrate material 1 after the wiring substrate material 1 is rinse-treated by the rinse treatment unit 50.

The ultraviolet irradiation treatment unit 30 of the first exemplary desmearing device has a housing 31 which is dependent (separate) from other treatment units.

The physical vibration treatment unit 40, the rinse treatment unit 50 and the drying treatment unit 60 are housed in a common housing 65 such that these treatment units 40 to 60 are arranged in a direction of conveying the wiring substrate material 1. The housing 65 has a tank 67 for reserving water, which is used in the physical vibration treatment unit 40, and another tank 68 for reserving water, which is used in the rinse treatment unit 50. The housing 65 also has an air outlet 65H in its side wall near the drying treatment unit 60.

Between the ultraviolet irradiation treatment unit 30 and the physical vibration treatment unit 40, there is provided a conveyance robot (transfer robot) 25 for conveying the wiring substrate material 1 to the physical vibration treatment unit 40 from the ultraviolet irradiation treatment unit 30. The conveyance robot 25 has a suction arm 26 for sucking and holding the wiring substrate material 1. Inside the housing 65, there is arranged a conveyance mechanism 66 for conveying the wiring substrate material 1 from the physical vibration treatment unit 40 to the rinse treatment unit 50, and then to drying treatment unit 60.

In the ultraviolet irradiation treatment unit 30, the above-described ultraviolet irradiation treatment is carried out to the wiring substrate material 1.

In the housing 31 of the ultraviolet irradiation treatment unit 30, there is provided a lamp chamber S1 for housing a plurality of excimer lamps 10, which emit the ultraviolet beams at the wavelength equal to or less than 220 nm. An ultraviolet transmitting window member 32 is disposed in the lower face of the housing 31. The window member 32 is made from, for example, a synthetic quartz glass. A treatment chamber S2 is provided below the lamp chamber S1, with the ultraviolet transmitting window member 32 being interposed between the treatment chamber S2 and the lamp chamber S1. The wiring substrate material 1 is conveyed into the treatment chamber S2.

A stage 33 for supporting the wiring substrate material 1 thereon is disposed in the treatment chamber S2. The stage 33 has a gas feed opening 34a for feeding a treatment gas into the treatment chamber S2, and a gas outlet opening 34b for discharging a gas from the treatment chamber S2.

A heater is embedded in the stage 33. The heater can heat the wiring substrate material 1 placed on the stage 33 to a temperature of, for example, 80 to 200 degrees C.

The above-described physical vibration treatment is carried out in the physical vibration treatment unit 40. Specifically, the supersonic vibrations are applied to the wiring substrate material 1 in the water inside the physical vibration treatment unit 40.

The physical vibration treatment unit 40 has a water vessel 41. A vibrating plate 42 is disposed in the water vessel 41. The water vessel 41 has a water outlet 41H.

The water reserved in the tank 67 is fed (pumped) to the water vessel 41 by a pump 43 via a filter 44. The water discharged from the water outlet 41H is recovered by the tank 67. Accordingly, the water in the water vessel 41 is circulated via the filter 44.

The distance to the water surface from the upper surface of the vibrating plate 42 is preferably 30 to 300 mm. If this distance is less than 30 mm, the life of the vibrating plate 42 itself may be shortened due to the reflection of the supersonic wave. On the other hand, if the distance exceeds 300 mm, an electric power density drops, and therefore the inorganic smear may become difficult to remove.

In the physical vibration treatment unit 40, the physical vibration treatment is applied to the wiring substrate material 1. The physical vibration treatment is performed while the wiring substrate material 1 is being conveyed by the conveyance mechanism 66. The conveying speed of the wiring substrate material 1 may be appropriately decided depending upon the treatment time, the size of the water vessel 41 or the like. For example, the conveying speed is 0.5 m/min.

An exemplary specification of the physical vibration treatment unit 40 is shown below.

The long side and short side of the water vessel 41 are 700 mm×800 mm.

The long side and short side of the vibrating plate 42 are 500 mm×600 mm. The drive power for the vibrating plate 42 is 2 kW.

The rinse treatment to the wiring substrate material 1 is carried out in the rinse treatment unit 50. Specifically, the water is sprayed to the wiring substrate material 1 in the rinse treatment unit 50. The rinse treatment may be carried out while the wiring substrate material 1 is being conveyed by the conveyance mechanism 66.

The rinse treatment unit 50 has a spray nozzle 56 for spraying the water to the wiring substrate material 1. The water reserved in the tank 68 is pumped to the spray nozzle 56 by a pump 57 via a filter 58. The water sprayed from the spray nozzle 56 is recovered by the tank 68. This allows the water, which is used for the rinse treatment, to be circulated and reused via the filter 58.

The pressure of the water injected from the spray nozzle 56 is, for example, 0.1 to 0.5 MPa.

The drying treatment unit 60 injects the air to the wiring substrate material 1 to perform the drying treatment to the wiring substrate material 1. The drying treatment may be performed while the wiring substrate material 1 is being conveyed by the conveyance mechanism 66.

The drying treatment unit 60 has a slit nozzle 61 for injecting the air to the wiring substrate material 1. The blower 62 feeds the air to the slit nozzle 61 via a filter 63. The air injected from the slit nozzle 61 is discharged out of the housing 65 via the air outlet opening 65H.

In the above-described desmearing device, the wiring substrate material 1 is placed on the stage 33 inside the treatment chamber S2 of the ultraviolet irradiation treatment unit 30. The treatment gas containing oxygen is supplied into the treatment chamber S2 from the gas feed opening 34a. The ultraviolet irradiation treatment to the wiring substrate material 1 is carried out as the excimer lamps 10 irradiate the wiring substrate material 1 with the ultraviolet beams.

After the ultraviolet irradiation treatment, the wiring substrate material 1 is conveyed to the physical vibration treatment unit 40 by the conveyance robot 25 and the conveyance mechanism 66. In the water vessel 41 of the physical vibration treatment unit 40, the physical vibration treatment is applied to the wiring substrate material 1 while the wiring substrate material 1 is being conveyed by the conveyance mechanism 66.

After the vibration treatment, the wiring substrate material 1 is moved to the rinse treatment unit 50 by the conveyance mechanism 66. Then, the rinse treatment is carried out to the wiring substrate material 1. Specifically, the spray nozzle 56 of the rinse treatment unit 50 sprays the water to the wiring substrate material 1 while the wiring substrate material 1 is being conveyed by the conveyance mechanism 66.

After the rinse treatment, the wiring substrate material 1 is conveyed to the drying treatment unit 60 by the conveyance mechanism 66. Then, the drying treatment is applied to the wiring substrate material 1. Specifically, the slit nozzle 61 of the drying treatment unit 60 injects (sprays) the air to the wiring substrate material 1 while the wiring substrate material 1 is being conveyed by the conveyance mechanism 66.

Figure 6:
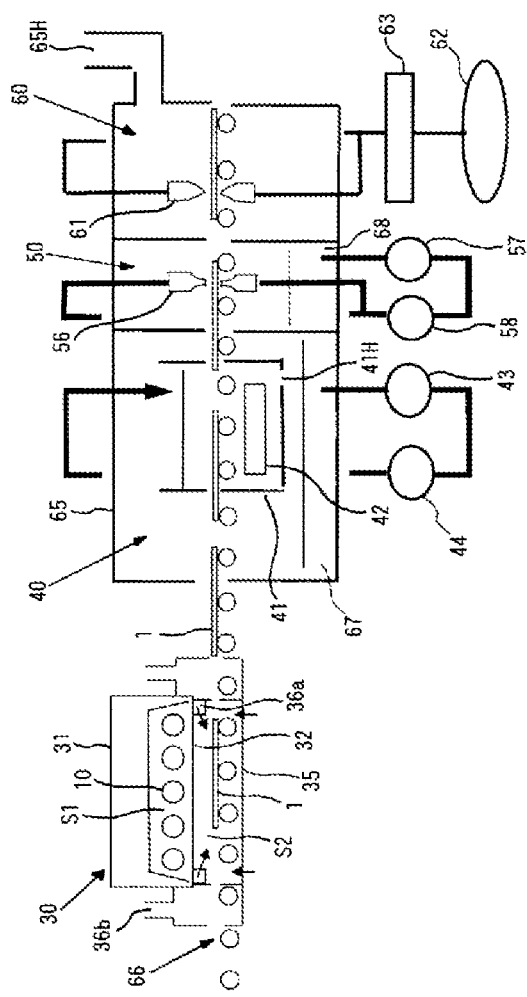
FIG. 6 is a view useful to describe a configuration of a desmearing device according to a second example of the present invention.

FIG. 6 is a view useful to illustrate a second exemplary configuration of the desmearing device according to the present invention. This desmearing device has an ultraviolet irradiation treatment unit 30 to irradiate the wiring substrate material 1 with the ultraviolet beams having the wavelength equal to or less than 220 nm. Downstream of the ultraviolet irradiation treatment unit 30, there is provided a physical vibration treatment unit 40 for applying physical vibrations to the wiring substrate material 1 which has undergone the ultraviolet irradiation treatment of the ultraviolet irradiation treatment unit 30. Downstream of the physical vibration treatment unit 40, there is provided a rinse treatment unit 50 for spraying the water to the wiring substrate material 1 which has undergone the vibration treatment of the physical vibration treatment unit 40. Downstream of the rinse treatment unit 50, there is provided a drying treatment unit 60 to apply the drying treatment to the wiring substrate material 1 which has undergone the rinsing treatment of the rinse treatment unit 50.

In the second exemplary configuration of the desmearing device, the ultraviolet irradiation treatment unit 30 has a housing 31 that is dependent (separate) from the other treatment units of the desmearing device.

The physical vibration treatment unit 40, the rinse treatment unit 50 and the drying treatment unit 60 are arranged in the conveying direction of the wiring substrate material 1 in a common housing 65. The structures of the physical vibration treatment unit 40, the rinse treatment unit 50, the drying treatment unit 60 and the housing 65 are the same as those of the first exemplary configuration of the desmearing device.

In the housing 31 of the ultraviolet irradiation treatment unit 30, there is disposed a lamp chamber S1 to house a plurality of excimer lamps 10 configured to emit ultraviolet beams at a wavelength equal to or less than 220 nm. An ultraviolet beam transmitting window member 32 is provided in a lower face of the housing 31. The ultraviolet beam transmitting window member 32 may be made from synthetic quartz glass. Below the lamp chamber S1, there is disposed a treatment chamber S2 into which the wiring substrate material 1 is conveyed through the ultraviolet beam transmitting window member 32. The treatment chamber S2 is defined by the lower face of the housing 31 and a box-shaped treatment chamber member 35. Specifically, the treatment chamber member 35 has an opening in its upper face, and the housing 31 is placed over the treatment chamber member 35 to close the opening of the treatment chamber member 35.

The treatment chamber member 35 has a plurality of gas inlets 36a for receiving the treatment gas into the treatment chamber S2, and a plurality of gas outlets 36b for discharging the gas from the treatment chamber S2. A conveyance mechanism 66 is provided in the treatment chamber member 35 and the housing 65 to convey (move) the wiring substrate material 1 through the ultraviolet irradiation treatment unit 30, the physical vibration treatment unit 40, the rinse treatment unit 50, and the drying treatment unit 60 in this order. The conveyance mechanism 66 is common to the treatment chamber member 33 and the housing 65. The ultraviolet irradiation treatment to the wiring substrate material 1 may be carried out while the wiring substrate material 1 is being conveyed by the conveyance mechanism 66.

In the above-described desmearing device, the wiring substrate material 1 is carried into the treatment chamber S2 of the ultraviolet irradiation treatment unit 30 by the conveyance mechanism 66. The treatment gas containing oxygen is fed to the treatment chamber S2 from the gas inlets 36a. In the treatment chamber S2, the ultraviolet irradiation treatment to the wiring substrate material 1 is carried out. Specifically, the excimer lamps 10 irradiate the wiring substrate material 1 with the ultraviolet beams while the wiring substrate material 1 is being moved by the conveyance mechanism 66.

After the ultraviolet irradiation treatment, the wiring substrate material 1 is conveyed to the physical vibration treatment unit 40 by the conveyance robot 25 and the conveyance mechanism 66. In the water vessel 41 of the physical vibration treatment unit 40, the physical vibration treatment is applied to the wiring substrate material 1 while the wiring substrate material 1 is being moved by the conveyance mechanism 66.

After the vibration treatment, the wiring substrate material 1 is moved to the rinse treatment unit 50 by the conveyance mechanism 66. Then, the rinse treatment is carried out to the wiring substrate material 1. Specifically, the spray nozzle 56 of the rinse treatment unit 50 sprays the water to the wiring substrate material 1 while the wiring substrate material 1 is being conveyed by the conveyance mechanism 66.

After the rinse treatment, the wiring substrate material 1 is conveyed to the drying treatment unit 60 by the conveyance mechanism 66. Then, the drying treatment is applied to the wiring substrate material 1. Specifically, the slit nozzle 61 of the drying treatment unit 60 injects the air to the wiring substrate material 1 while the wiring substrate material 1 is being conveyed by the conveyance mechanism 66.

Figure 7:
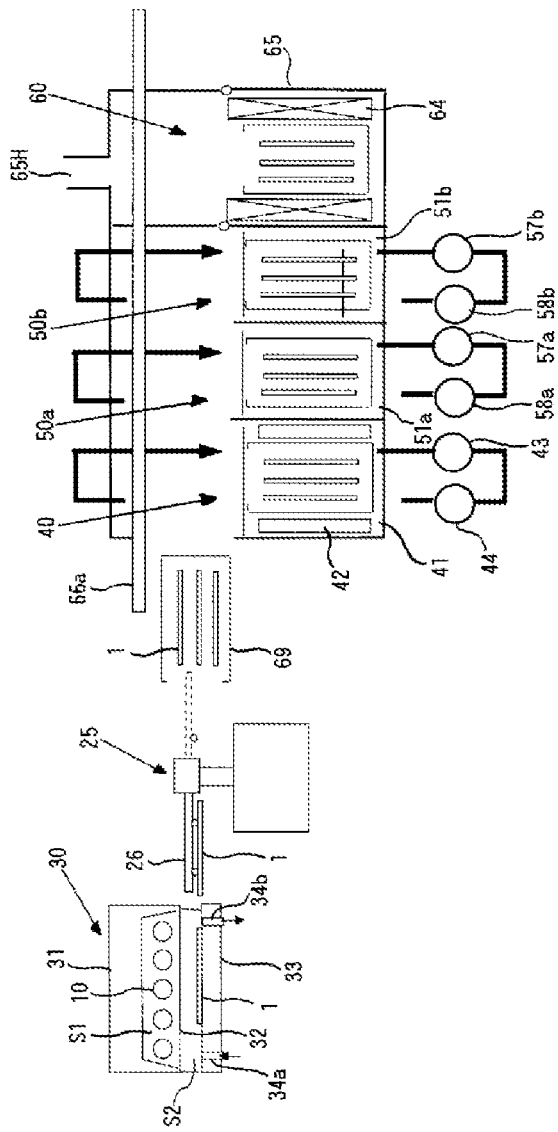
FIG. 7 is a view useful to describe a configuration of a desmearing device according to a third example of the present invention.

FIG. 7 is a view useful to illustrate a third exemplary configuration of the desmearing device according to the present invention. This desmearing device has an ultraviolet irradiation treatment unit 30 to irradiate the wiring substrate material 1 with the ultraviolet beams having the wavelength equal to or less than 220 nm. Downstream of the ultraviolet irradiation treatment unit 30, there is provided a physical vibration treatment unit 40 for applying physical vibrations to the wiring substrate materials 1 which has undergone the ultraviolet irradiation treatment of the ultraviolet irradiation treatment unit 30. Downstream of the physical vibration treatment unit 40, there are provided a first rinse treatment unit 50a and a second rinse unit 50b for immersing the wiring substrate materials 1, which have undergone the vibration treatment of the physical vibration treatment unit 40, in water. The first rinse treatment unit 50a and the second rinse unit 50b are arranged in this order in the conveying direction of the wiring substrate material 1. Downstream of the second rinse treatment unit 50b, there is provided a drying treatment unit 60 to apply the drying treatment to the wiring substrate materials 1 which have undergone the rinsing treatment of the second rinse treatment unit 50b.

In the third exemplary configuration of the desmearing device, the ultraviolet irradiation treatment unit 30 has the same structure as the ultraviolet irradiation unit 30 of the first exemplary configuration of the desmearing device.

The physical vibration treatment unit 40, the first rinse treatment unit 50a, the second rinse treatment unit 50b, and the drying treatment unit 60 are arranged side by side in the conveying direction of the wiring substrate material 1 in a common housing 65. The housing 65 has an air outlet 65H in the upper face of the drying treatment unit 60.

Between the ultraviolet irradiation treatment unit 30 and the physical vibration treatment unit 40, there is provided a conveyance robot 25 for conveying the wiring substrate material 1 into a conveyance basket (cage, carrier) 69 (will be described) from the ultraviolet irradiation treatment unit 30. The conveyance robot 25 has a suction arm 26 to suck and hold the wiring substrate material 1.

Each of the physical vibration treatment unit 40, the first rinse treatment unit 50a, the second rinse treatment unit 50b, and the drying treatment unit 60 performs the respective treatment to each of a plurality of wiring substrate materials 1, with the wiring substrate materials 1 being received in the conveyance basket 69. In the housing 65, there is disposed a conveyance rail 66a for conveying the conveyance basket 69, which has the wiring substrate materials 1 therein, through the physical vibration treatment unit 40, the first rinse treatment unit 50a, the second rinse treatment unit 50b, and the drying treatment unit 60 in this order.

In the physical vibration treatment unit 40, the above-described physical vibration treatment is carried out. Specifically, the supersonic wave treatment is applied to the wiring substrate materials 1 in the conveyance basket 69.

The physical vibration treatment unit 40 has a water vessel 41 to receive the conveyance basket 69, which carries the wiring substrate materials 1 therein. Two vibration plates 42 are disposed in the water vessel 41 such that the two vibration plates 42 stand vertically and face each other. The water in the water vessel 41 is circulated by a pump 43 via a filter 44.

In each of the first rinse treatment unit 50a and the second rinse treatment unit 50b, the rinsing treatment is applied to the wiring substrate materials 1. Specifically, the wiring substrate materials 1 housed in the conveyance basket 69 are immersed in water.

The first rinse treatment unit 50a has a water vessel 51a to receive the conveyance basket 69 which carries the wiring substrate materials 1 therein, and the second rinse treatment unit 50b has a water vessel 51b to receive the conveyance basket 69 which carries the wiring substrate materials 1 therein. The water in the water vessel 51a is circulated by a pump 57a via a filter 58a, and the water in the water vessel 51b is circulated by a pump 57b via a filter 58b.

Two heaters 64 are disposed in the drying treatment unit 60 such that the two heaters 64 face each other with a distance. In the drying treatment unit 60, the conveyance basket 69 which carries the wiring substrate materials 1 therein is placed between the two heaters 64. The drying treatment is applied to the wiring substrate materials 1 as the wiring substrate materials 1 in the conveyance basket 69 are heated by the heaters 64.

The wiring substrate material 1 is placed on the stage 33 in the treatment chamber S2 of the ultraviolet irradiation treatment unit 30 of the above-described desmearing device. A treatment gas containing oxygen is supplied into the treatment chamber S2 from the gas supply opening 34a. The ultraviolet irradiation treatment is applied to the wiring substrate material 1 as the excimer lamps 10 irradiate the wiring substrate material 1 with the ultraviolet beams.

After the ultraviolet irradiation treatment, the wiring substrate material 1 is conveyed into the conveyance basket 69 by the conveyance robot 25. The conveyance basket 69 which carries the wiring substrate materials 1 therein is conveyed along the conveyance rail 66a, and moved into the water vessel 41 of the physical vibration unit 40. The physical vibration treatment is applied to the wiring substrate materials 1 in the water vessel 41.

Subsequently, the conveyance basket 69 which carries the wiring substrate materials 1 is conveyed along the conveyance rail 66a, and immersed in the water in the water vessel 51a of the first rinse unit 50a. After that, the conveyance basket 69 which carries the wiring substrate materials 1 is conveyed along the conveyance rail 66a, and immersed in the water in the water vessel 51b of the second rinse unit 50b. In this manner, the rinse treatments are applied to the wiring substrate materials 1.

Then, the conveyance basket 69 which carries the wiring substrate materials 1 is conveyed along the conveyance rail 66a, and placed between the two heaters 64 of the drying treatment unit 60. Subsequently, the drying treatment is carried out to the wiring substrate materials 1 as the wiring substrate materials 1 are heated by the heaters 64.

Figure 8:
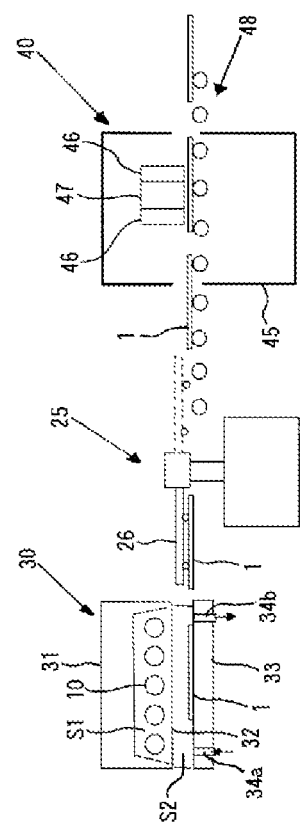
FIG. 8 is a view useful to describe a configuration of a desmearing device according to a fourth example of the present invention.

FIG. 8 is a view useful to illustrate a fourth exemplary configuration of the desmearing device according to the present invention. This desmearing device has an ultraviolet irradiation treatment unit 30 to irradiate the wiring substrate material 1 with the ultraviolet beam having the wavelength equal to or less than 220 nm. The ultraviolet irradiation unit 30 has the same structure as the ultraviolet irradiation unit 30 of the first exemplary configuration of the desmearing device. Downstream of the ultraviolet irradiation treatment unit 30, there is provided a physical vibration treatment unit 40 for applying physical vibrations to the wiring substrate material 1 which has undergone the ultraviolet irradiation treatment of the ultraviolet irradiation treatment unit 30. Between the ultraviolet irradiation treatment unit 30 and the physical vibration treatment unit 40, there is provided a conveyance robot 25 for conveying the wiring substrate material 1 to the physical vibration treatment unit 40 from the ultraviolet irradiation treatment unit 30. The conveyance robot 25 has a suction arm 26 to suck and hold the wiring substrate material 1.

The physical vibration treatment unit 40 of the fourth exemplary configuration of the desmearing device injects (sprays) the compressed air to the wiring substrate material 1 while the compressed air is being vibrated with a supersonic wave. The physical vibration treatment is applied to the wiring substrate material 1 in this manner. The physical vibration treatment unit 40 has a housing 45. The housing 45 has an compressed air injection opening 46 for injecting the compressed and supersonic-vibrated air to the wiring substrate material 1 in the housing 45, and a smear suction hole 47 for sucking the smear which is separated from the wiring substrate material 1 upon application of the physical vibration treatment. Inside the housing 45, there is provided a conveyance mechanism 48 for conveying the wiring substrate material 1. An exemplary unit for feeding the compressed and supersonic-vibrated air is disclosed in Japanese Utility Model Application Laid-Open Publication No. 5-80573, Japanese Patent Application Laid-Open Publication No. 7-60211, and Japanese Patent Application Laid-Open Publication No. 7-68226.

In the above-described desmearing device, the wiring substrate material 1 is placed on the stage 33 inside the treatment chamber S2 of the ultraviolet irradiation treatment unit 30. A treatment gas containing oxygen is fed into the treatment chamber S2 from the gas inlet opening 34a. Then, the excimer lamps 10 irradiate the wiring substrate material 1 with ultraviolet beams to apply the ultraviolet irradiation treatment to the wiring substrate material 1.

After the ultraviolet irradiation treatment, the wiring substrate material 1 is conveyed to the physical vibration treatment unit 40 by the conveyance robot 25 and the conveyance mechanism 66. Then, the physical vibration treatment is applied to the wiring substrate material 1. Specifically, the compressed air, which is forced to vibrate with a supersonic wave, is injected to the wiring substrate material 1 from the compressed air injection hole 46 while the wiring substrate material 1 is being conveyed by the conveyance mechanism 66.

Figure 9:
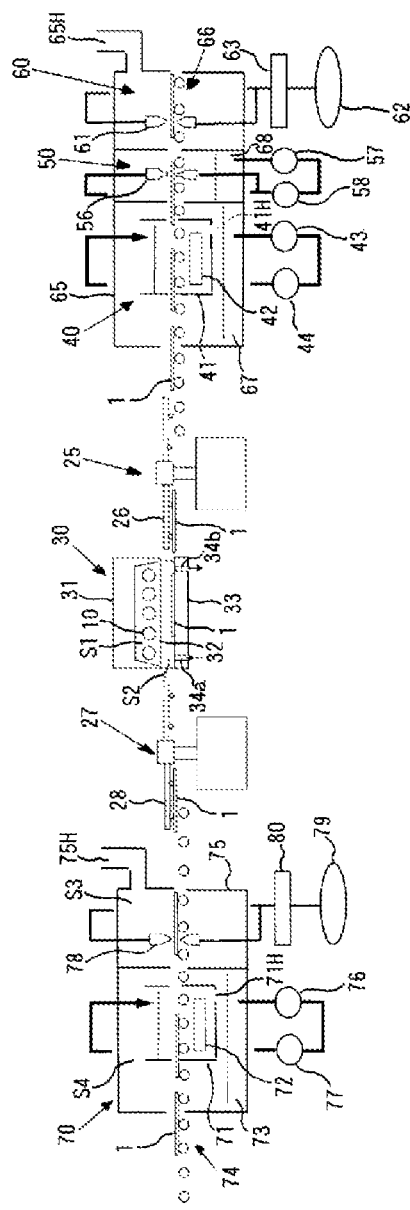
FIG. 9 is a view useful to describe a configuration of a desmearing device according to a fifth example of the present invention.

FIG. 9 is a view useful to illustrate a fifth exemplary configuration of the desmearing device according to the present invention. This desmearing device has a wetting treatment unit 70 for wetting a treatment target part of the wiring substrate material 1. Downstream of the wetting treatment unit 70, there is provided an ultraviolet irradiation treatment unit 30 for irradiating the wiring substrate material 1, which has undergone the wetting treatment, with the ultraviolet beam having the wavelength equal to or less than 220 nm. Downstream of the ultraviolet irradiation treatment unit 30, there is provided a physical vibration treatment unit 40 for applying physical vibrations to the wiring substrate material 1 which has undergone the ultraviolet irradiation treatment of the ultraviolet irradiation treatment unit 30. Downstream of the physical vibration treatment unit 40, there are provided a rinse treatment unit 50 for spraying the water to the wiring substrate material 1, which has undergone the vibration treatment of the physical vibration treatment unit 40. Downstream of the rinse treatment unit 50, there is provided a drying treatment unit 60 for applying the drying treatment to the wiring substrate material 1 which has undergone the rinsing treatment of the rinse treatment unit 50. The ultraviolet irradiation treatment unit 30, the physical vibration treatment unit 40, the rinse treatment unit 50 and the drying treatment unit 60 of the fifth exemplary configuration of the desmearing device have the same structures as those of the first exemplary configuration of the desmearing device. A conveyance robot 27 is provided between the wetting treatment unit 70 and the ultraviolet irradiation treatment unit 30 to convey the wiring substrate material 1 to the ultraviolet irradiation treatment unit 30 from the wetting treatment unit 70. The conveyance robot 27 has a suction arm 28 to suck and hold the wiring substrate material 1.

The wetting treatment unit 70 has a housing 75. Inside the housing 75, there are provided a wetting treatment chamber S3 to apply the wetting treatment to the wiring substrate material 1, and a water removal treatment chamber S4 to remove excessive water from the wiring substrate material 1 after the wetting treatment. A conveyance mechanism 74 is also provided in the housing 75 to convey the wiring substrate material 1 to the water removal treatment chamber S4 from the wetting treatment chamber S3.

The above-described wetting treatment is carried out in the wetting treatment unit 70. Specifically, the wiring substrate material 1 is immersed in the water, and the water is forced to vibrate with the supersonic wave while the wiring substrate material 1 is situated in the water.

A water vessel 71 is provided in the wetting treatment chamber S3 of the wetting treatment unit 70. A vibration plate 72 is disposed in the water vessel 71. The water vessel 71 has a water outlet 71H. A tank 73, which is used in the wetting treatment, is disposed below the water vessel 71. The water reserved in the tank 73 is fed to the water vessel 71 by a pump 76 via a filter 77. The water discharged from the water outlet 71H is recovered by the tank 73. Accordingly, the water in the water vessel 71 is circulated via the filter 77.

A slit nozzle 78 is disposed in the water removal treatment chamber S4 to inject the air to the wiring substrate material 1. The air is fed to the slit nozzle 78 by a blower 79 via a filter 80. The air injected from the slit nozzle 78 is expelled out of the housing 75 from the air outlet 75H of the housing 75.

In the above-described desmearing device, the conveyance mechanism 74 conveys the wiring substrate material 1 to the water vessel 71 of the wetting treatment unit 70. Then, the wetting treatment is carried out to the wiring substrate material 1 in the water vessel 71. Specifically, the water is forced to vibrate with a supersonic wave while the wiring substrate material 1 is being moved by the conveyance mechanism 74. After the wetting treatment, the wiring substrate material 1 is conveyed to the water removal treatment chamber S4 by the conveyance mechanism 74. Then, the air is injected to the wiring substrate material 1 from the slit nozzle 78 while the wiring substrate material 1 is being moved by the conveyance mechanism 74. Thus, the excessive water is removed from the wiring substrate material 1.

After the wiring substrate material 1 has undergone the wetting treatment in the above-described manner, the wiring substrate material 1 is conveyed and placed on the stage 33 in the treatment chamber S2 of the ultraviolet irradiation treatment unit 30 by the conveyance robot 27. In the meantime, the treatment gas containing oxygen is fed into the treatment chamber S2 from the gas inlet opening 34a. Then, the excimer lamps 10 irradiate the wiring substrate material 1 with the ultraviolet beams to carry out the ultraviolet irradiation treatment to the wiring substrate material 1.

After the ultraviolet irradiation treatment, the wiring substrate material 1 is conveyed to the physical vibration treatment unit 40 by the conveyance robot 25 and the conveyance mechanism 66. Then, the physical vibration treatment is applied to the wiring substrate material 1 in the water vessel 41 of the physical vibration treatment unit 40 while the wiring substrate material 1 is being conveyed by the conveyance mechanism 66.

After the vibration treatment, the wiring substrate material 1 is moved to the rinse treatment unit 50 by the conveyance mechanism 66. Then, the rinse treatment is carried out to the wiring substrate material 1. Specifically, the spray nozzle 56 of the rinse treatment unit 50 sprays the water to the wiring substrate material 1 while the wiring substrate material 1 is being conveyed by the conveyance mechanism 66.

After the rinse treatment, the wiring substrate material 1 is conveyed to the drying treatment unit 60 by the conveyance mechanism 66. Then, the drying treatment is applied to the wiring substrate material 1. Specifically, the slit nozzle 61 of the drying treatment unit 60 injects the air to the wiring substrate material 1 while the wiring substrate material 1 is being conveyed by the conveyance mechanism 66.

The above-described desmearing devices apply the physical vibration treatment of the physical vibration treatment unit 40 after the ultraviolet irradiation treatment of the ultraviolet irradiation treatment unit 30. Therefore, these desmearing devices can remove any of the inorganic substance smear and the organic substance smear from the wiring substrate material 1 in a reliable manner.

It should be noted that the desmearing device according to the present invention is not limited to the above-described embodiments nor the exemplary configurations, but various changes and modifications may be made to the illustrated embodiments and exemplary configurations as will be described below.

(1) When any of the first, third, fourth and fifth exemplary configurations of the desmearing device needs to perform the desmearing treatment to both surfaces of the wiring substrate material 1, the ultraviolet irradiation treatment unit 30 may apply the ultraviolet irradiation treatment to one surface of the wiring substrate material 1, and then the conveyance robot 25 may turn the wiring substrate material 1 upside down. After that, the ultraviolet irradiation treatment unit 30 may apply the ultraviolet irradiation treatment to the other surface of the wiring substrate material 1.

(2) When the second exemplary configuration of the desmearing device needs to perform the desmearing treatment to both surfaces of the wiring substrate material 1, the excimer lamps 10 may be arranged at upper and lower locations in the treatment chamber S2 of the ultraviolet irradiation treatment unit 30. The upper and lower excimer lamps 10 may simultaneously irradiate the upper and lower surfaces of the wiring substrate material 1 with the ultraviolet beams to apply the ultraviolet irradiation treatment to the two opposite surfaces of the wiring substrate material 1 simultaneously.

(3) Any of the first, second and fifth exemplary configurations of the desmearing device may have the vibration plates 42 above and below the wiring substrate material 1 in the water vessel 41 of the physical vibration treatment unit 40. This modification can increase the electric power density of the supersonic wave. Accordingly, it is possible to reduce the length of each of the vibration plates 42, and in turn to reduce the entire length of the desmearing device.

(4) The fifth exemplary configuration of the desmearing device may include a dry-type ultraviolet irradiation treatment unit for irradiating the treatment target part of the wiring substrate material 1 with the ultraviolet beam before the wiring substrate material 1 is moved to the wetting treatment unit 70. The dry-type ultraviolet irradiation treatment unit may have the same structure as the above-described ultraviolet irradiation treatment unit 30. This modification can use the dry-type ultraviolet irradiation treatment unit to improve the wettability of the treatment target part of the wiring substrate material 1. As a result, it is possible to reliably wet the treatment target part of the wiring substrate material 1 in the wetting treatment unit 70.

EXAMPLES

Now, specific examples of the present invention will be described, but it should be noted that the present invention is not limited to such examples.

Preparation of Sample Wiring Substrate Material for Testing

An insulation layer having a thickness of 100 μm was formed on a copper foil (copper layer) having a thickness of 100 μm to prepare a laminated body. The insulation layer was an epoxy resin layer that contained silica. The average particle diameter of the silica was 1.0 μm, and the silica was contained in the epoxy resin by 40 mass %.

The laser machining was applied to the insulation layer of the laminated boy by a carbon dioxide gas ($CO_2$) laser to make a through hole in the insulation layer. The through hole had a diameter of 50 μm. This brought about the sample wiring substrate material for testing. The inventors observed the bottom of the through hole of the sample wiring substrate material with a scanning electron microscope, and confirmed that there was smear remaining on the bottom of the through hole.

Example 1

The ultraviolet irradiation treatment and the physical vibration treatment, which will be described below, were applied to the sample wiring substrate material to carry out the desmearing treatment to the sample wiring substrate material.

(1) Ultraviolet Irradiation Treatment Step

In the atmosphere, the interior of the through hole of the sample wiring substrate material was irradiated with an ultraviolet beam, which was emitted from an ultraviolet irradiation device having a xenon excimer lamp, under the following conditions.

Conditions for Ultraviolet Irradiation Treatment:
Ultraviolet irradiance at an outer surface of an ultraviolet emission window of the ultraviolet irradiation device was 40 $W/cm^2$.

Distance between the ultraviolet emission window of the ultraviolet irradiation device and the sample wiring substrate material was 3 mm.

Ultraviolet irradiation time was 180 minutes.

(2) Physical Vibration Treatment Step

After the ultraviolet irradiation treatment step, which is described above in the (1) section, the sample wiring substrate material was immersed in pure water. The supersonic wave vibration treatment was applied to the sample wiring substrate material with a supersonic wave of 40.0 kHz for three minutes while the sample wiring substrate material was situated in the pure water.

Evaluation

After the desmearing treatment, the bottom of the sample wiring substrate material was observed with a scanning electron microscope to evaluate a remaining amount of the organic substance smear derived from the resin and a remaining amount of the inorganic substance smear derived from the filler on the basis of the following criteria.

Good: No residual smear was found.

No Good (NG): Substantial amount of residual smear was found.

Results of the evaluation are shown in Table 1.

Example 2

The ultraviolet irradiation treatment and the physical vibration treatment, which will be described below, were alternately applied three times to the sample wiring substrate material to carry out the desmearing process to the sample wiring substrate material. After the desmearing process, the same evaluation as Example 1 was conducted to the sample wiring substrate material. Results of the evaluation are shown in Table 1.

(1) Ultraviolet Irradiation Treatment Step

In the atmosphere, the interior of the through hole of the sample wiring substrate material was irradiated with an ultraviolet beam, which was emitted from an ultraviolet irradiation device having a xenon excimer lamp, under the following conditions. After the desmearing process, the same evaluation as Example 1 was conducted to the sample wiring substrate material. Results of the evaluation are shown in Table 1.

Conditions for Ultraviolet Irradiation Treatment:
Ultraviolet irradiance at an outer surface of an ultraviolet emission window of the ultraviolet irradiation device was 40 $W/cm^2$.

Distance between the ultraviolet emission window of the ultraviolet irradiation device and the sample wiring substrate material was 3 mm.

Ultraviolet irradiation time was 30 minutes.

(2) Physical Vibration Treatment Step

After the ultraviolet irradiation treatment, which is described above in the (1) section, the sample wiring substrate material was immersed in pure water. The supersonic wave vibration treatment was applied to the sample wiring substrate material with a supersonic wave of 40.0 kHz for three minutes while the sample wiring substrate material was in the pure water.

Example 3

The ultraviolet irradiation treatment and the physical vibration treatment, which will be described below, were applied to the sample wiring substrate material to carry out the desmearing process to the sample wiring substrate material. After the desmearing process, the same evaluation as Example 1 was conducted to the sample wiring substrate material. Results of the evaluation are shown in Table 1.

(1) Ultraviolet Irradiation Treatment Step

The interior of the through hole of the sample wiring substrate material was irradiated with the ultraviolet beam in the same manner as Example 1.

(2) Physical Vibration Treatment Step

After the ultraviolet irradiation treatment, which is described above in the (1) section, the compressed air of 0.2 MPa was injected to the interior of the through hole of the sample wiring substrate material for ten seconds while the compressed air is being caused to vibrate with a supersonic wave of 30.0 kHz.

Comparative Example 1

The desmearing process was applied to the sample wiring substrate material in the following manner.

In the atmosphere, the interior of the through hole of the sample wiring substrate material was irradiated with an ultraviolet beam, which was emitted from an ultraviolet irradiation device having a xenon excimer lamp, under the following conditions. After the ultraviolet irradiation treatment, the sample wiring substrate material was cleaned with a high-pressure water jet. After the desmearing process, the sample wiring substrate material was evaluated in the same manner as Example 1. Results of the evaluation are shown in Table 1.

Conditions for Ultraviolet Irradiation Treatment:

Ultraviolet irradiance at an outer surface of an ultraviolet emission window of the ultraviolet irradiation device was 40 W/cm$^2$.

Distance between the ultraviolet emission window of the ultraviolet irradiation device and the sample wiring substrate material was 3 mm.

Ultraviolet irradiation time was 90 minutes.

Comparative Example 2

The desmearing process was applied to the sample wiring substrate material in the same manner as Comparative Example 1 except for the ultraviolet irradiation time being changed to 120 minutes. Then, the sample wiring substrate material was evaluated. Results of the evaluation are shown in Table 1.

Comparative Example 3

The desmearing process was applied to the sample wiring substrate material in the same manner as Comparative Example 1 except for the ultraviolet irradiation time being changed to 180 minutes. Then, the sample wiring substrate material was evaluated. Results of the evaluation are shown in Table 1.

Comparative Example 4

The sample wiring substrate material was immersed in pure water, and a supersonic vibration treatment was applied to the sample wiring substrate material with a supersonic wave of 40.0 kHz for ten minutes while the sample wiring substrate material was in the pure water. Thus, the desmearing process was applied to the sample wiring substrate material.

After the desmearing process, the sample wiring substrate material was evaluated in the same manner as Example 1. Results of the evaluation are shown in Table 1.

Comparative Example 5

The compressed air of 0.2 MPa was injected to the interior of the through hole of the sample wiring substrate material for ten seconds while the compressed air is being caused to vibrate with a supersonic wave of 30 kHz. Thus, the desmearing process was applied to the sample wiring substrate material.

After the desmearing process, the sample wiring substrate material was evaluated in the same manner as Example 1. Results of the evaluation are shown in Table 1.

TABLE 1

| | UV Irradiation Treatment | | | Supersonic | | Remaining Smear | |
|---|---|---|---|---|---|---|---|
| | Irradiance (W/cm$^2$) | Treatment Time (min) | Vibration Medium | Frequency (kHz) | Treatment Time (sec) | Organic Smear | Inorganic Smear |
| Example 1 | 40 | 180 | Pure Water | 40 | 180 | Good | Good |
| Example 2 | 40 | 30 × 3 | Pure Water | 40 | 180 × 3 | Good | Good |
| Example 3 | 40 | 180 | Compressed Air | 30 | 10 | Good | Good |
| Comparison 1 | 40 | 90 | — | — | — | NG | NG |
| Comparison 2 | 40 | 120 | — | — | — | NG | NG |
| Comparison 3 | 40 | 180 | — | — | — | Good | NG |
| Comparison 4 | — | — | Pure Water | 40 | 600 | NG | NG |
| Comparison 5 | — | — | Compressed Air | 30 | 10 | NG | NG |

As obvious from the evaluation results show in Table 1, it was confirmed that both of the inorganic substance smear and the organic substance smear were certainly removed from the wiring substrate material when the desmearing processes of Examples 1 to 3 were used. In particular, when the desmearing process of Example 2 was used, the ultraviolet irradiation treatment and the physical vibration treatment were alternately and repeatedly carried out. Thus, it is possible to reduce the total time of ultraviolet irradiation in the ultraviolet irradiation treatment as compared to the ultraviolet irradiation time of the desmearing process of Example 1.

On the contrary, when the processes of Comparative Examples 1 to 3 were used, the cleaning treatment was carried out with high-pressure water jets instead of the physical vibration treatment. As a result, the smear remained on the sample wiring substrate material after the desmearing process. Especially, an amount of the remaining inorganic substance smear was significant. The inventors assume that this is because the high-pressure water jets did not sufficiently penetrate into the interior of the through hole of the sample wiring substrate material.

In Comparative Examples 4 and 5, the ultraviolet irradiation treatment was not applied to the sample wiring substrate material. Thus, both of the inorganic substance smear and the organic substance smear were hardly removed.

Example 4

The wettability improvement treatment and the wetting treatment, which will be described below, were applied to the sample wiring substrate material.

(1) Wettability Improvement Treatment Step

The dry-type ultraviolet irradiation treatment was applied to the sample wiring substrate material in the atmosphere. Specifically, the interior of the through hole of the sample wiring substrate material was irradiated with an ultraviolet beam, which was emitted from an ultraviolet irradiation device having a xenon excimer lamp, under the following conditions.

Conditions for Dry-Type Ultraviolet Irradiation Treatment:

Ultraviolet irradiance at an outer surface of an ultraviolet emission window of the ultraviolet irradiation device was 40 $W/cm^2$.

Distance between the ultraviolet emission window of the ultraviolet irradiation device and the sample wiring substrate material was 3 mm.

Ultraviolet irradiation time was 60 seconds.

(2) Wetting Treatment Step

The sample wiring substrate material was immersed in pure water for three minutes. Subsequently, excessive water which was present at the treatment target part of the wiring substrate material, was removed by an air knife.

After that, the desmearing process was applied to the sample wiring substrate material by carrying out the wet-type ultraviolet irradiation treatment and the physical vibration treatment, which will be described below, to the sample wiring substrate material.

(3) Wet-Type Ultraviolet Irradiation Treatment Step

The interior of the through hole of the sample wiring substrate material was irradiated with an ultraviolet beam, which was emitted from an ultraviolet irradiation device having a xenon excimer lamp, under the following conditions.

Conditions for Ultraviolet Irradiation Treatment:

Ultraviolet irradiance at an outer surface of an ultraviolet emission window of the ultraviolet irradiation device was 40 $W/cm^2$.

Distance between the ultraviolet emission window of the ultraviolet irradiation device and the sample wiring substrate material was 3 mm.

Ultraviolet irradiation time was 150 minutes.

(4) Physical Vibration Treatment Step

After the wet-type ultraviolet irradiation treatment, which is described above in the (3) section, the sample wiring substrate material was immersed in pure water. The supersonic wave vibration treatment was applied to the sample wiring substrate material with a supersonic wave of 40.0 kHz for three minutes while the sample wiring substrate material was in the pure water.

Evaluation

After the desmearing process, the bottom of the sample wiring substrate material was observed with a scanning electron microscope to evaluate a remaining amount of the organic substance smear derived from the resin and a remaining amount of the inorganic substance smear derived from the filler on the basis of the following criteria.

Good: No residual smear was found.

No Good: Substantial amount of residual smear was found.

Results of the evaluation are shown in Table 2.

Example 5

The desmearing process was carried out to the sample wiring substrate material in the same manner as Example 1 except for the excessive water removal from the treatment target part of the wiring substrate material with the air knife being not performed in the wetting treatment and the ultraviolet irradiation time being changed to 120 minutes in the wet-type ultraviolet beam treatment. After the desmearing process, the same evaluation as Example 1 was conducted to the sample wiring substrate material. Results of the evaluation are shown in Table 2.

Example 6

The desmearing process was carried out to the sample wiring substrate material in the same manner as Example 1 except for the way of carrying out the wetting treatment, which will be described below, and the ultraviolet irradiation time being changed to 60 minutes in the wet-type ultraviolet beam treatment. After the desmearing process, the same evaluation as Example 1 was conducted to the sample wiring substrate material. Results of the evaluation are shown in Table 2.

Wetting Treatment:

The sample wiring substrate material was immersed in pure water for three minutes while the sample wiring substrate material was being forced to vibrate with a supersonic wave of 40 kHz. Removal of excessive water which was present at the treatment target part of the wiring substrate material, was not carried out.

Example 7

The wettability improvement treatment was applied to the sample wiring substrate material as in the same manner as Example 3.

Subsequently, the wetting treatment and the wet-type ultraviolet irradiation treatment were alternately carried out four times to the sample wiring substrate material in those manner which will be described below. After that, the physical vibration treatment, which will be described below, was applied to the sample wiring substrate material to complete the desmearing process to the sample wiring substrate material. After the desmearing process, the sample wiring substrate material was evaluated in the same manner as Example 1. Results of the evaluation are shown in Table 2.

(1) Wetting Treatment Step

The sample wiring substrate material was immersed in pure water for three minutes. Subsequently, excessive water which was present on the treatment target part of the wiring substrate material was removed by an air knife.

(2) Wet-Type Ultraviolet Irradiation Treatment Step

The interior of the through hole of the sample wiring substrate material was irradiated with an ultraviolet beam, which was emitted from an ultraviolet irradiation device having a xenon excimer lamp, under the following conditions. After the desmearing process, the sample wiring substrate material was evaluated in the same manner as Example 1. Results of the evaluation are shown in Table 2.

Conditions for Ultraviolet Irradiation Treatment:

Ultraviolet irradiance at an outer surface of an ultraviolet emission window of the ultraviolet irradiation device was 40 W/cm$^2$.

Distance between the ultraviolet emission window of the ultraviolet irradiation device and the sample wiring substrate material was 3 mm.

Ultraviolet irradiation time was 10 minutes.

(3) Physical Vibration Treatment Step

The sample wiring substrate material was immersed in pure water. The supersonic wave vibration treatment was applied to the sample wiring substrate material with a supersonic wave of 40.0 kHz for three minutes while the sample wiring substrate material was in the pure water.

Example 8

The wettability improvement treatment and the wetting treatment were applied to the sample wiring substrate material in the same manner as Example 3.

The wet-type ultraviolet irradiation treatment and the physical vibration treatment were alternately carried out three times to the sample wiring substrate material in those manner which will be described below, thereby carrying out the desmearing process to the sample wiring substrate material. After the desmearing process, the sample wiring substrate material was evaluated in the same manner as Example 1. Results of the evaluation are shown in Table 2.

(1) Wet-Type Ultraviolet Irradiation Treatment Step

The interior of the through hole of the sample wiring substrate material was irradiated with an ultraviolet beam, which was emitted from an ultraviolet irradiation device having a xenon excimer lamp, under the following conditions in the atmosphere. After the desmearing process, the sample wiring substrate material was evaluated in the same manner as Example 1. Results of the evaluation are shown in Table 2.

Conditions for Ultraviolet Irradiation Treatment:

Ultraviolet irradiance at an outer surface of an ultraviolet emission window of the ultraviolet irradiation device was 40 W/cm$^2$.

Distance between the ultraviolet emission window of the ultraviolet irradiation device and the sample wiring substrate material was 3 mm.

Ultraviolet irradiation time was 10 minutes.

(2) Physical Vibration Treatment Step

After the above-described wet-type ultraviolet irradiation treatment (1) was finished, the sample wiring substrate material was immersed in water. With this condition, the supersonic vibration treatment using a 40.0 kHz supersonic wave was applied to the sample wiring substrate material for three minutes.

Example 9

The desmearing process was applied to the sample wiring substrate material in the same manner as Example 1 except for the wettability improvement treatment being not carried out. Then, the sample wiring substrate material was evaluated in the same manner as Example 1. Results of the evaluation are shown in Table 2.

Comparative Example 6

The desmearing process was applied to the sample wiring substrate material in the following manner.

In the atmosphere, the interior of the through hole of the sample wiring substrate material was irradiated with an ultraviolet beam, which was emitted from an ultraviolet irradiation device having a xenon excimer lamp, under the following conditions. After the ultraviolet irradiation treatment, the sample wiring substrate material was cleaned with high-pressure water jets. After the desmearing process, the sample wiring substrate material was evaluated in the same manner as Example 1. Results of the evaluation are shown in Table 2.

Conditions for Ultraviolet Irradiation Treatment:

Ultraviolet irradiance at an outer surface of an ultraviolet emission window of the ultraviolet irradiation device was 40 W/cm$^2$.

Distance between the ultraviolet emission window of the ultraviolet irradiation device and the sample wiring substrate material was 3 mm.

Ultraviolet irradiation time was 180 minutes.

Comparative Example 7

The sample wiring substrate material was immersed in pure water, and the supersonic wave vibration treatment was applied to the sample wiring substrate material with a supersonic wave of 40.0 kHz for 180 minutes while the sample wiring substrate material was in the pure water. Thus, the desmearing process was applied to the sample wiring substrate material.

After the desmearing process, the sample wiring substrate material was evaluated in the same manner as Example 1. Results of the evaluation are shown in Table 2.

TABLE 2

| | Wettability Improvement Treatment | | Wetting Treatment | | | Wet-Type UV Irradiation Treatment | | Physical Vibration Treatment | | Remaining Smear | |
|---|---|---|---|---|---|---|---|---|---|---|---|
| | Irradiance (W/cm²) | Treatment Time (sec) | Time (min) | Supersonic Vibration | Removal of Excessive Water | Irradiance (W/cm²) | Time (min) | Frequency (kHz) | Treatment Time (sec) | Organic Smear | Inorganic Smear |
| Example 1 | 40 | 60 | 3 | Not Applied | Done | 40 | 150 | 40 | 180 | Good | Good |
| Example 2 | 40 | 60 | 3 | Not Applied | Not Done | 40 | 120 | 40 | 180 | Good | Good |
| Example 3 | 40 | 60 | 1 | Applied | Not Done | 40 | 60 | 40 | 180 | Good | Good |
| Example 4 | 40 | 60 | 3 × 4 | Not Applied | Done | 40 | 10 × 4 | 40 | 180 | Good | Good |
| Example 5 | 40 | 60 | 1 | Applied | Not Done | 40 | 10 × 3 | 40 | 180 × 3 | Good | Good |
| Example 6 | — | — | — | — | — | 40 | 180 | 40 | 180 | Good | Good |
| Comparison 1 | — | — | — | — | — | 40* | 180* | — | — | Good | NG |
| Comparison 2 | — | — | — | — | — | — | — | 40 | 180 min | NG | NG |

*Dry-type UV irradiation treatment was applied to Comparison 1

As clear from the evaluation results shown in Table 2, it was confirmed that the desmearing process of each of Examples 4 to 9 certainly removed both of the inorganic substance smear and the organic substance smear from the wiring substrate material.

The desmearing process of each of Examples 4 to 8 carries out the wettability improvement treatment. It was then confirmed that the smear was certainly removed by the desmearing processes of Examples 4 to 8 even though the ultraviolet irradiation time in the ultraviolet irradiation treatment was short as compared to the desmearing process of Example 9.

The desmearing process of Example 7 carries out the wetting treatment and the ultraviolet irradiation treatment alternately and repeatedly. Thus, it is possible to reduce the total ultraviolet irradiation time of the wet-type ultraviolet irradiation treatments as compared to the ultraviolet irradiation time of the ultraviolet irradiation treatment in the desmearing process of each of Examples 1 to 3.

Because the desmearing process of Example 8 carries out the ultraviolet irradiation treatment and the physical vibration treatment alternately and repeatedly, it is possible to reduce the total time of ultraviolet irradiation of the ultraviolet irradiation treatments as compared to the ultraviolet irradiation time of the wet-type ultraviolet irradiation treatment in the desmearing process of each of Examples 4 to 6.

In contrast, because the physical vibration treatment was not carried out in Comparative Example 6, the smear remained on the sample wiring substrate material after the desmearing process. In particular, a considerable amount of inorganic substance smear remained.

In Comparative Example 7, the ultraviolet irradiation treatment was not applied to the sample wiring substrate material. Thus, it was hardly possible to remove the inorganic substrate smear and the organic substance smear.

REFERENCE NUMERALS

1: Wiring substrate material
2: First insulation layer
3: Conductive layer
4: Second insulation layer
5: Through hole
6: Smear
7: Organic substance smear
8: Inorganic substance smear
10: Excimer lamp
11: Discharge container
15: One electrode (high voltage feed electrode)
16: Another electrode (earth electrode)
18: Light emission part (aperture part)
20: Ultraviolet reflection film
25: Conveyance robot
26: Suction arm
27: Conveyance robot
28: Suction arm
30: Ultraviolet irradiation treatment unit
31: Housing
32: Ultraviolet beam transmission window
33: Stage
34a: Gas inlet opening
34b: Gas outlet opening
35: Treatment chamber material
36a: Gas inlet opening
36b: Gas outlet opening
40: Physical vibration treatment unit
41: Water vessel
41H: Water outlet
42: vibrating plate
43: Pump
44: Filter
45: Housing
46: Pressurized air injection hole
47: Smear suction hole
48: Conveyance mechanism
50: Rinse Treatment unit
50a: First rinse treatment part
50b: Second rinse treatment part
51a, 51b: Water vessel
56: Spray nozzle
57, 57a, 57b: Pump
58, 58a, 58b: Filter
60: Drying unit
61: Slit nozzle
62: Blower
63: Filter
64: Heater
65: Housing
65H: Air outlet
66: Conveyance mechanism
66a: Conveyance rail
67, 68: Tank
69: Conveyance basket
70: Wetting treatment unit
71: Water vessel
71H: Water outlet
72: vibrating plate
73: Tank 74: Conveyance mechanism
75: Housing
75H: Air outlet
76: Pump
77: Filter
78: Slit nozzle
79: Blower
80: Filter
S1: Lamp chamber
S2: Treatment chamber
S3: Wetting treatment chamber
S4: Water removal treatment chamber

What is claimed is:

1. A desmearing method for a wiring substrate material that includes a laminated body of an insulating layer made from resin containing a filler and a conductive layer, said wiring substrate material having a through hole that penetrates through said insulation layer, said desmearing method comprising, in this order:
   an ultraviolet irradiation treatment step of irradiating the wiring substrate material with an ultraviolet beam with a wavelength equal to or less than 220 nm in an atmosphere thereby removing a smear, which is derived from an organic substance, from the wiring substrate material; and
   a physical vibration treatment step of applying physical vibrations to the wiring substrate material which has undergone the ultraviolet irradiation treatment step thereby removing a smear, which is derived from an inorganic substance, from the wiring substrate material.

2. The desmearing method according to claim 1, wherein the ultraviolet irradiation treatment step is carried out in an atmosphere containing oxygen in a closed housing.

3. The desmearing method according to claim 2, wherein the through hole that penetrates through the insulation layer is formed by laser beam machining.

4. The desmearing method according to claim 2, wherein the ultraviolet irradiation treatment step and the physical vibration treatment step are carried out alternately and repeatedly.

5. The desmearing method according to claim 2, wherein the physical vibration treatment step includes an ultrasonic vibration treatment.

6. The desmearing method according to claim 1, wherein the ultraviolet irradiation treatment step is applied to that part of the wiring substrate material which is subject to the ultraviolet irradiation treatment step while said part of the wiring substrate material is in a wet condition.

7. The desmearing method according to claim 6, further including, as a pretreatment to be performed prior to the ultraviolet irradiation treatment step, a wetting step of immersing the wiring substrate material in water and causing the water to supersonic-vibrate, with the wiring substrate material being in water, thereby wetting said part of the wiring substrate material.

8. The desmearing method according to claim 6 further including, as a pretreatment to be performed prior to the ultraviolet irradiation treatment step:
   a wettability improvement step of improving wettability of said part of the wiring substrate material, with said part of the wiring substrate material being not in a wet condition; and
   a wetting step of wetting said part of the wiring substrate material which has undergone the wettability improvement step.

9. The desmearing method according to claim 8, wherein the wettability improvement step includes a dry-type ultraviolet beam irradiation treatment that irradiates said part of the wiring substrate material with an ultraviolet beam while said part of the wiring substrate material is not in the wet condition.

10. The desmearing method according to claim 7, wherein the wetting step and the ultraviolet irradiation treatment step are carried out alternately and repeatedly prior to the physical vibration treatment step.

11. The desmearing method according to claim 6, wherein the ultraviolet irradiation treatment step and the physical vibration treatment step are carried out alternately and repeatedly.

12. A desmearing device for a wiring substrate material that is a laminated body of an insulating layer made from resin containing a filler and a conductive layer, said wiring substrate material having a through hole that penetrates through said insulation layer, said desmearing device comprising:
   an ultraviolet irradiation treatment unit configured to irradiate the wiring substrate material with an ultraviolet beam with a wavelength equal to or less than 220 nm in an atmosphere thereby removing a smear, which is derived from an organic substance, from the wiring substrate material; and
   a physical vibration treatment unit configured to apply physical vibrations to the wiring substrate material which is ultraviolet-treated by the ultraviolet irradiation treatment unit thereby removing a smear, which is derived from an inorganic substance, from the wiring substrate material.

13. The desmearing device according to claim 12, wherein the physical vibration treatment unit has at least one plate, and causes said at least one plate to vibrate in order to apply ultrasonic vibrations to the wiring substrate material.

14. The desmearing device according to claim 12, wherein the ultraviolet irradiation treatment unit has a treatment chamber, and the treatment chamber is a closed housing configured to receive the wiring substrate material, and the ultraviolet irradiation treatment unit also has a gas feed opening configured to feed a treatment gas containing oxygen into the treatment chamber.

15. The desmearing device according to claim 12, further including a wetting unit configured to wet that part of the wiring substrate material which is subject to the ultraviolet irradiation treatment before the wiring substrate material is treated by the ultraviolet irradiation treatment unit.

16. The desmearing device according to claim 15, wherein the wetting unit is configured to immerse the wiring substrate material in water, and cause the water to supersonic-vibrate while the wiring substrate material is in the water, thereby wetting said part of the wiring substrate material.

17. The desmearing device according to claim 15, further including a dry-type ultraviolet irradiation unit configured to irradiate said part of the wiring substrate material with an ultraviolet beam before the wiring substrate material is treated by the wetting unit.

18. The desmearing method according to claim 8, wherein the wetting step and the ultraviolet irradiation treatment step are carried out alternately and repeatedly prior to the physical vibration treatment step.

* * * * *